United States Patent
Egawa

(10) Patent No.: US 8,502,886 B2
(45) Date of Patent: Aug. 6, 2013

(54) SOLID-STATE IMAGE SENSING DEVICE

(75) Inventor: Yoshitaka Egawa, Yokohama-shi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 13/151,093

(22) Filed: Jun. 1, 2011

(65) Prior Publication Data

US 2011/0228152 A1 Sep. 22, 2011

Related U.S. Application Data

(62) Division of application No. 11/938,462, filed on Nov. 12, 2007, now Pat. No. 7,969,484.

(30) Foreign Application Priority Data

Nov. 13, 2006 (JP) ................................. 2006-307257

(51) Int. Cl.
*H04N 5/235* (2006.01)
*H04N 5/228* (2006.01)
*H04N 9/73* (2006.01)
*H03M 1/12* (2006.01)

(52) U.S. Cl.
USPC .................. 348/229.1; 348/222.1; 348/223.1; 341/156

(58) Field of Classification Search
USPC .......... 348/216.1, 222.1, 223.1, 229.1, 230.1, 348/308; 341/155, 156
See application file for complete search history.

(56) References Cited

U.S. PATENT DOCUMENTS

| | | | |
|---|---|---|---|
| 5,920,274 A | 7/1999 | Gowda et al. | |
| 7,345,613 B2 | 3/2008 | Higuchi | |
| 7,586,523 B2 | 9/2009 | Egawa et al. | |
| 7,830,436 B2 * | 11/2010 | Sumi et al. | 348/300 |
| 7,969,484 B2 * | 6/2011 | Egawa | 348/229.1 |
| 2002/0067303 A1 | 6/2002 | Lee et al. | |
| 2002/0080263 A1 | 6/2002 | Krymski | |
| 2006/0219866 A1 | 10/2006 | Egawa et al. | |
| 2007/0097240 A1 | 5/2007 | Egawa et al. | |
| 2008/0094271 A1 | 4/2008 | Tooyama et al. | |
| 2010/0231749 A1 | 9/2010 | Tatsuzawa et al. | |

FOREIGN PATENT DOCUMENTS

| | | |
|---|---|---|
| CN | 1842138 A | 10/2006 |
| JP | 2000-23044 | 1/2000 |
| JP | 2001-189893 | 7/2001 |
| JP | 2001-245213 | 9/2001 |
| JP | 2004-15927 | 1/2004 |
| TW | I260162 | 8/2006 |

OTHER PUBLICATIONS

Taiwanese Office Action issued Jun. 29, 2011, in Patent Application No. 096142049.
Extended European Search Report issued Jan. 25, 2012, in Patent Application No. 07021905.0.
Masaaki Sasaki, et al., "A Wide Dynamic Range CMOS Image Sensor with Multiple Short-Time Exposures", IEEE, XP 10793568, Oct. 24, 2004, pp. 967-972.

* cited by examiner

*Primary Examiner* — Daniel M Pasiewicz
(74) *Attorney, Agent, or Firm* — Oblon, Spivak, McClelland, Maier & Neustadt, L.L.P.

(57) ABSTRACT

There is provided a solid-state image sensing device including a pixel section in which cells are arrayed, each cell including a photoelectric conversion unit, a reading circuit reading out, to a detection unit, signal charges obtained by the photoelectric conversion unit, an amplifying circuit amplifying and outputting a voltage corresponding to the signal charges, and a reset circuit resetting the signal charges, an exposure time control circuit controlling an exposure time and controlling the exposure time to be equal for all cells, an A/D conversion circuit A/D-converting a signal output from the pixel section by changing a resolution of a signal level, line memories storing an A/D-converted signal, and a signal processing circuit processing output signals from the line memories to have a linear gradient with respect to an optical input signal amount by controlling an amplification factor in accordance with a resolution of a pixel output signal after A/D-conversion.

3 Claims, 34 Drawing Sheets

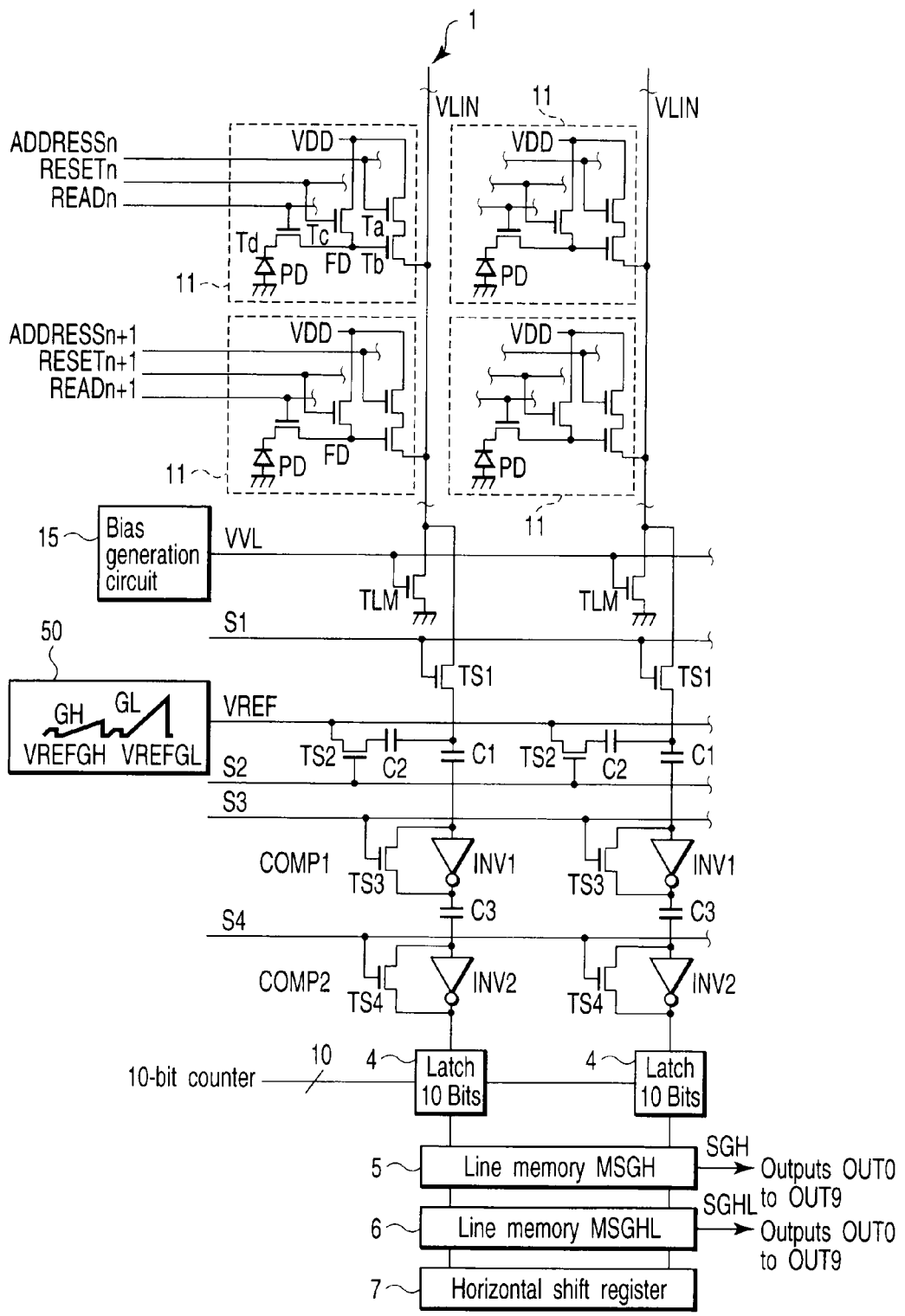
F I G. 2

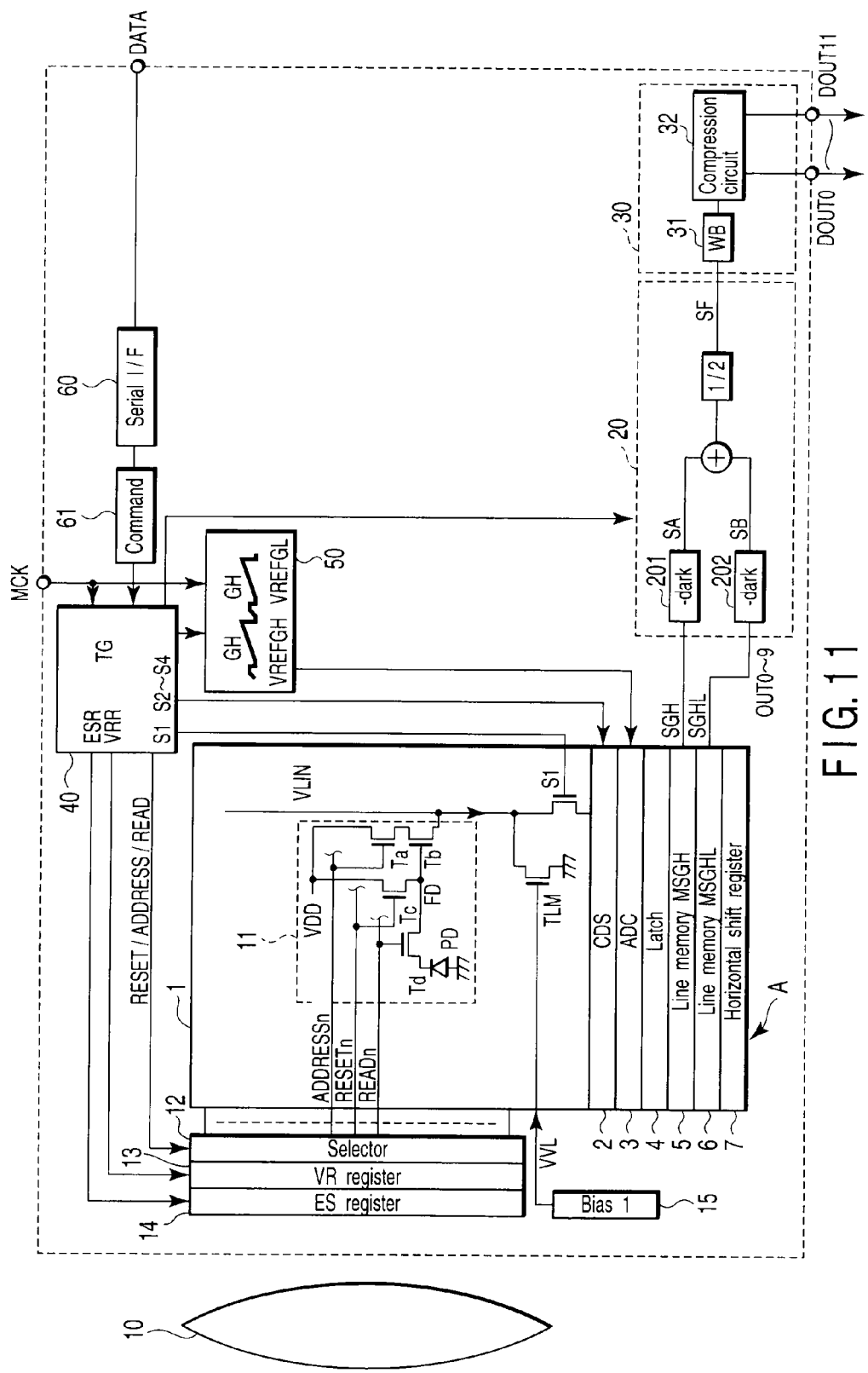
F I G. 11

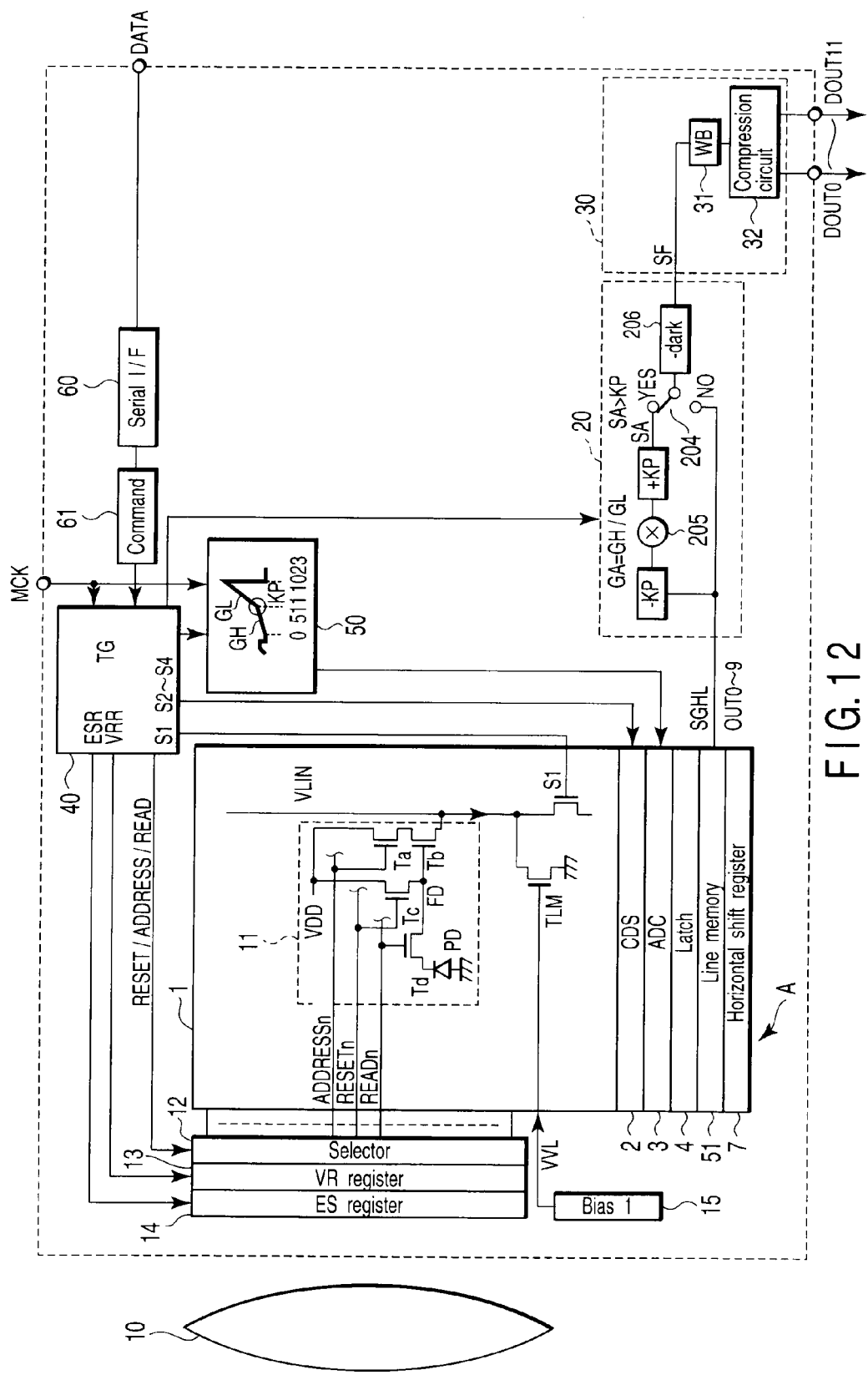
F I G. 12

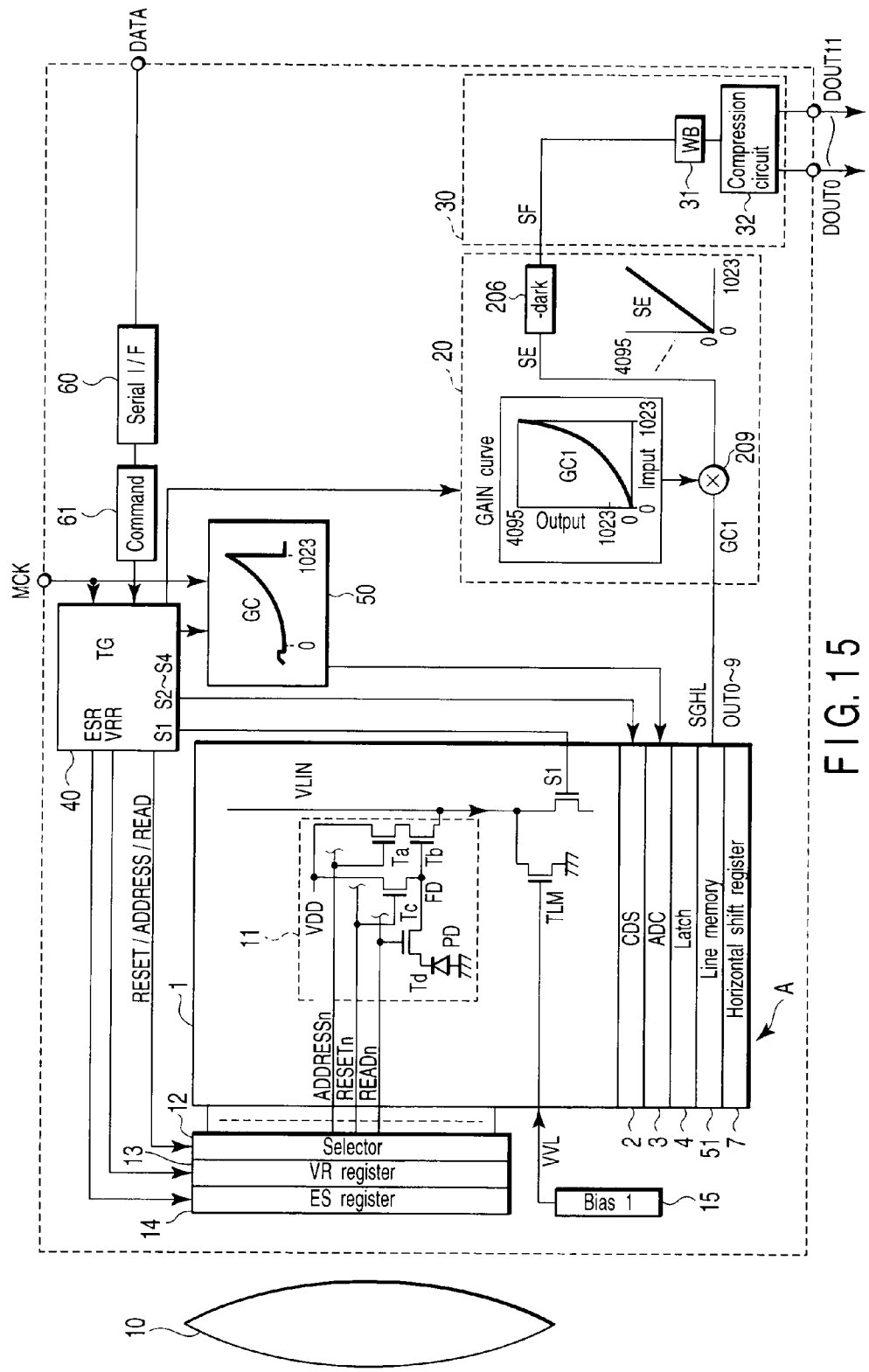
F I G. 15

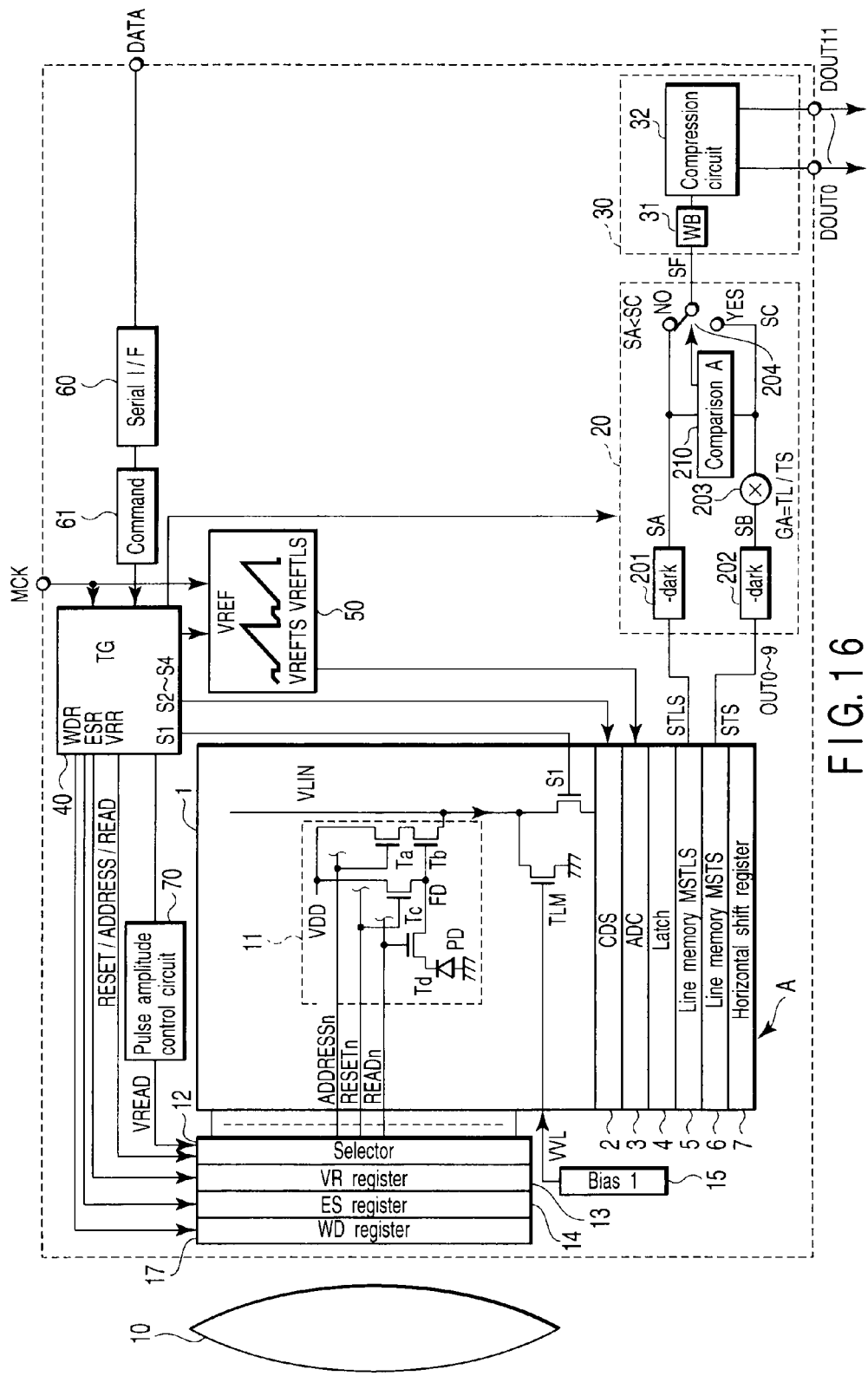
F I G. 16

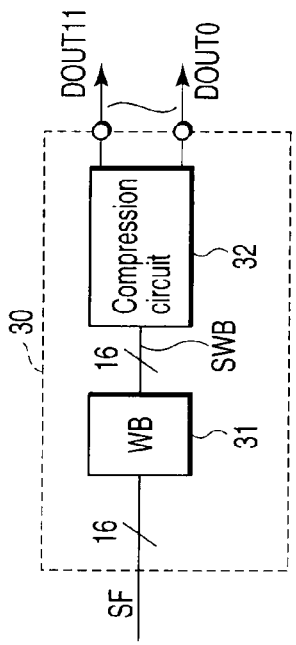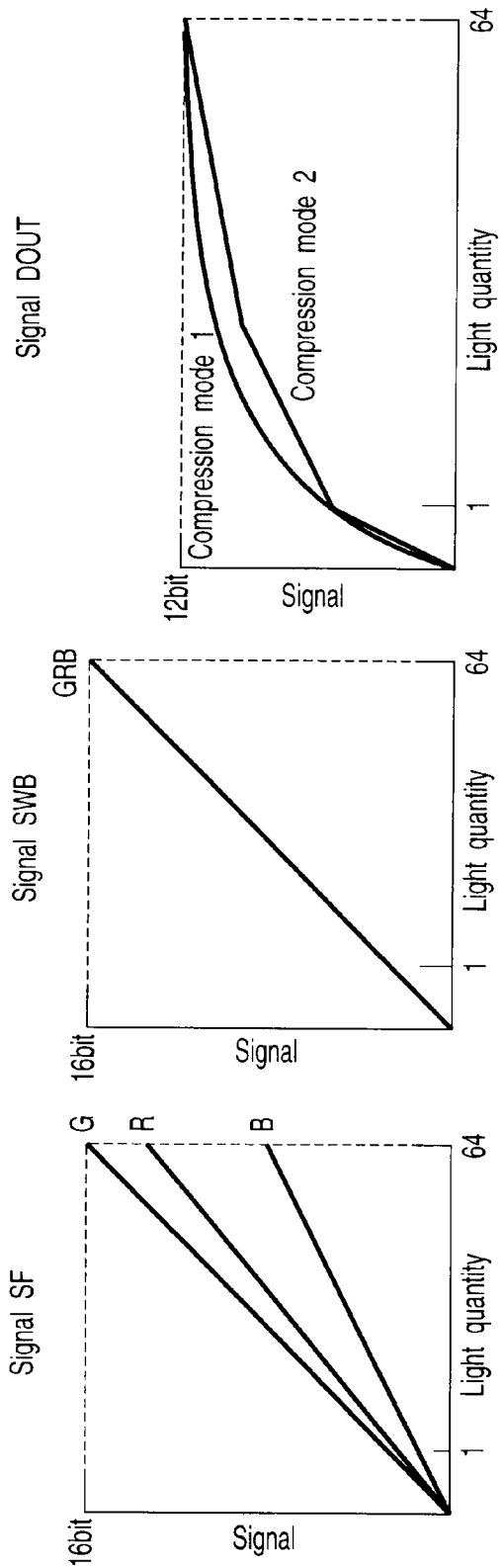
FIG. 21A FIG. 21B FIG. 21C FIG. 21D

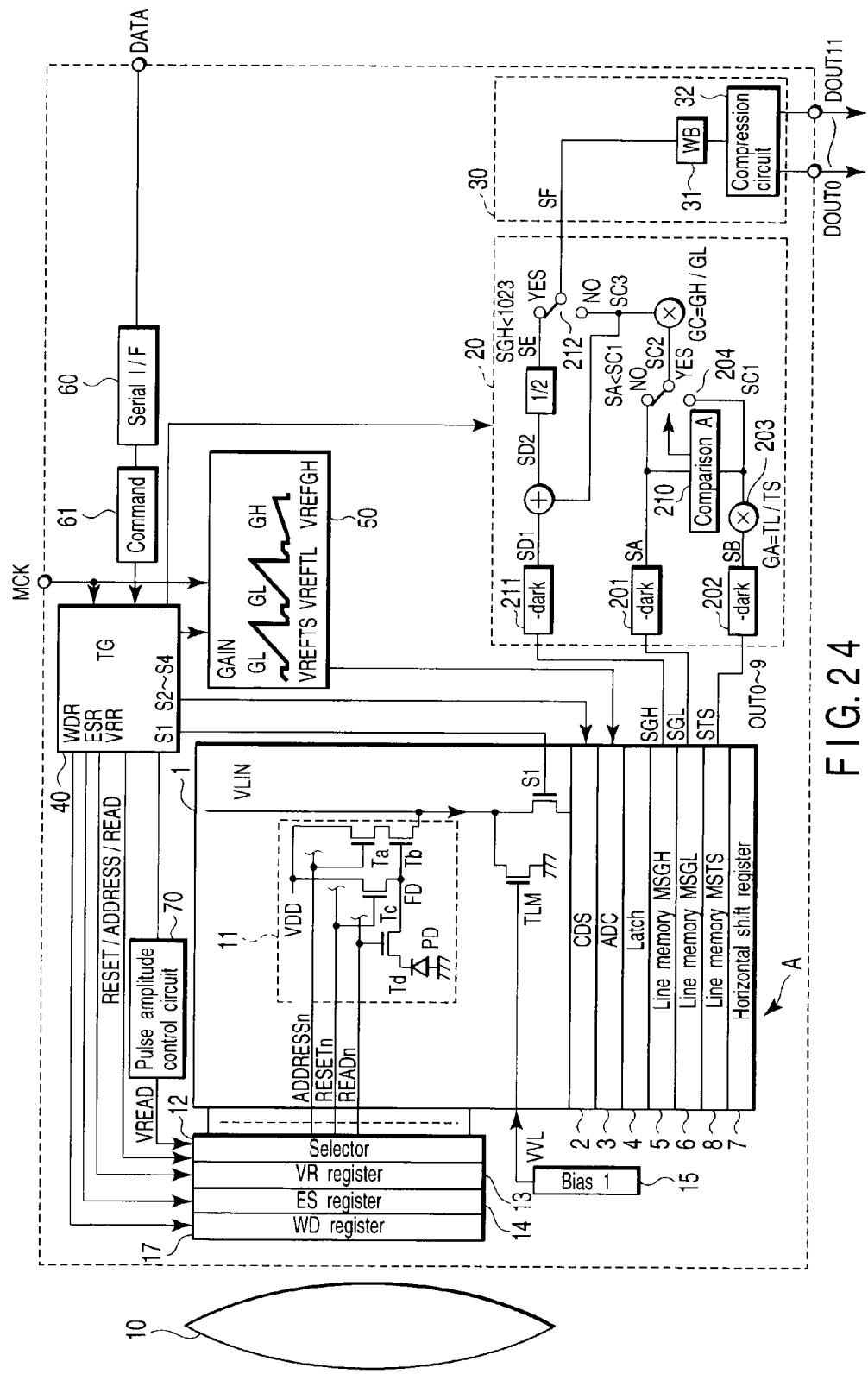
F I G. 24

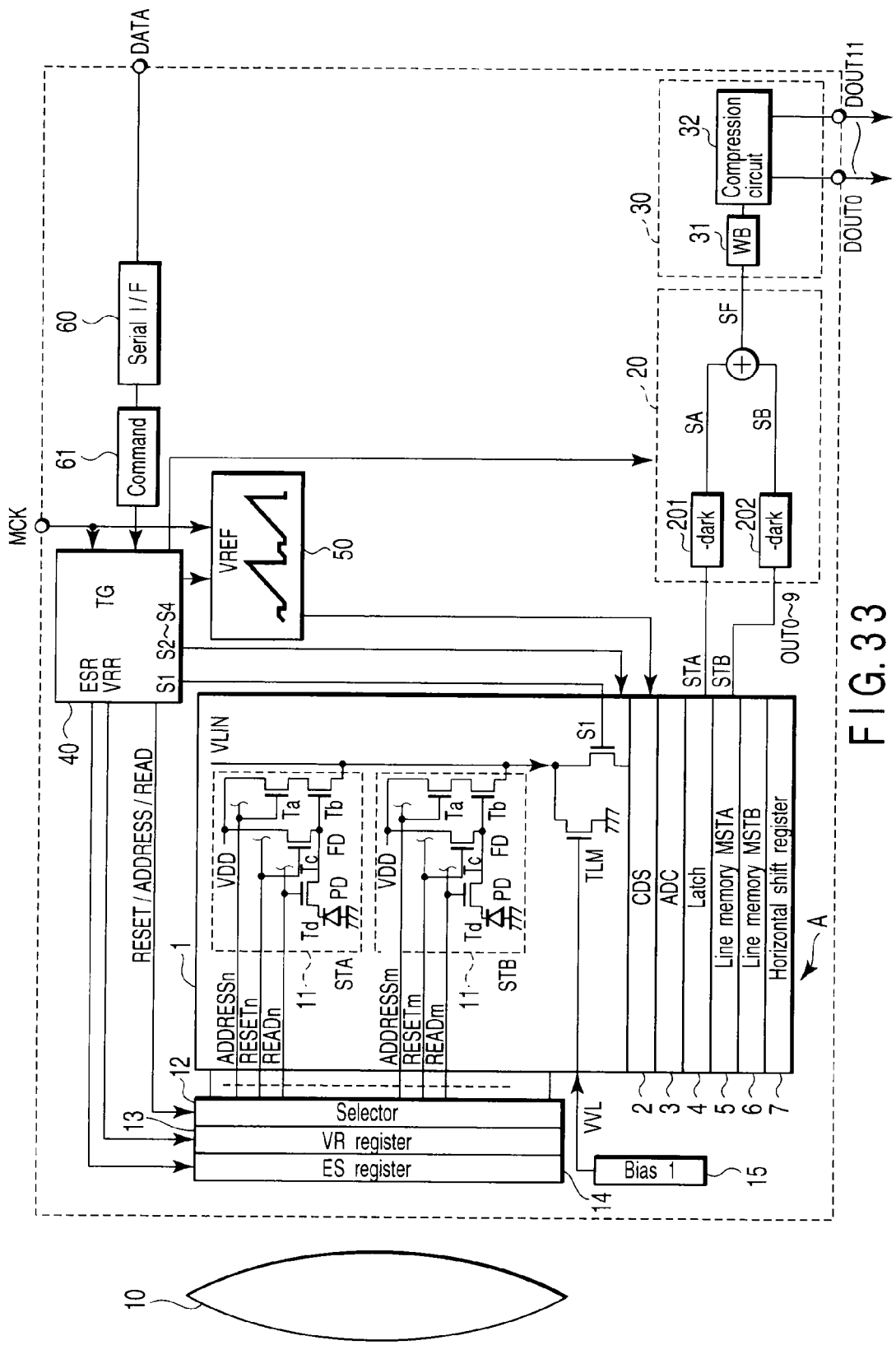
F I G. 33

SOLID-STATE IMAGE SENSING DEVICE

CROSS-REFERENCE TO RELATED APPLICATIONS

This application is a division of and claims the benefit of priority under 35 U.S.C. §120 from U.S. Ser. No. 11/938,462 filed Nov. 12, 2007, and claims the benefit of priority under 35 U.S.C. §119 from Japanese Patent Application No. 2006-307257 filed Nov. 13, 2006, the entire contents of each of which are incorporated herein by reference.

BACKGROUND OF THE INVENTION

1. Field of the Invention

The present invention relates to a solid-state image sensing device and, more particularly, to a CMOS image sensor used in a cell phone, digital camera, or video camera equipped with an image sensor.

2. Description of the Related Art

A conventional method of widening the dynamic range of a CMOS image sensor is described in, e.g., Jpn. Pat. Appln. KOKAI Publication Nos. 2001-189893 and 2000-23044. In Jpn. Pat. Appln. KOKAI Publication No. 2001-189893, the method of widening the dynamic range is applied to an incomplete transfer type photodiode. However, with this method an afterimage or white spot may form, and it is difficult to improve the image quality. To the contrary, the method in Jpn. Pat. Appln. KOKAI Publication No. 2000-23044 is applied to a complete transfer type photodiode. However, the dynamic range is widened using a detector, so nonuniformity in the dark and KTC noise may arise from leakage from the detector. The image quality may be degraded by a factor different from that in Jpn. Pat. Appln. KOKAI Publication No. 2001-189893. According to either method, a signal obtained by adding signals corresponding to long and short exposure times is output. It is difficult to divide the signal into those corresponding to long and short exposure times.

BRIEF SUMMARY OF THE INVENTION

According to an aspect of the invention, there is provided a solid-state image sensing device comprising: a pixel section in which cells are two-dimensionally arrayed in rows and columns on a semiconductor substrate, each cell including a photoelectric conversion unit, a reading circuit which reads out, to a detection unit, signal charges obtained by photoelectrically converting incident light by the photoelectric conversion unit, an amplifying circuit which amplifies and outputs a voltage corresponding to the signal charges stored in the detection unit, and a reset circuit which resets the signal charges of the detection unit; an exposure time control circuit which controls an exposure time during which the photoelectric conversion unit performs photoelectric conversion, and controls the exposure time to be equal for all cells; an A/D conversion circuit which A/D-converts a signal output from the pixel section by changing a resolution of a signal level; line memories which store a signal converted by the A/D conversion circuit; and a signal processing circuit which processes output signals from the line memories to have a linear gradient with respect to an optical input signal amount by controlling an amplification factor in accordance with a resolution of a pixel output signal after the A/D conversion circuit.

According to another aspect of the invention, there is provided a solid-state image sensing device comprising: a pixel section having photodiodes two-dimensionally arrayed on a semiconductor substrate, a reading circuit which reads out signal charges from the photodiodes to detectors, a detection circuit which converts the signal charges into a voltage, an output circuit which outputs the voltage of the detection circuit, and a reset circuit which resets the detection circuit, an exposure time control circuit which controls an exposure time during which the photodiode performs photoelectric conversion, a storage circuit which stores a signal output from the output circuit, an A/D conversion circuit which A/D-converts a signal stored in the storage circuit, a plurality of line memories which store signals converted by the A/D conversion circuit, and a signal processing circuit which processes a plurality of output signals from the plurality of line memories, wherein a signal photoelectrically converted and stored in the photodiode is read out by the reading circuit, and held in the detection circuit or storage circuit, and the held signal is A/D-converted by a plurality of number of times by the A/D conversion circuit, and the signal A/D-converted by a plurality of number of times is stored in the plurality of line memories, and the signal processing circuit comprises a synthesizing circuit which synthesizes a plurality of output signals simultaneously read out from the plurality of line memories into one signal.

According to another aspect of the invention, there is provided a solid-state image sensing device comprising: a pixel section having photodiodes two-dimensionally arrayed on a semiconductor substrate, a reading circuit which reads out signal charges from the photodiodes to detectors, an output circuit which outputs charges from the detectors, and a reset which resets the detectors, an exposure time control circuit which controls an exposure time during which the photodiode performs photoelectric conversion, a column amplifying circuit which amplifies a signal output from the output circuit, an A/D conversion circuit which A/D-converts a signal amplified by the column amplifying circuit, a plurality of line memories which store signals converted by the A/D conversion circuit, and a signal processing circuit which processes a plurality of output signals from the plurality of line memories, wherein a signal stored in the photodiode is read out by the reading circuit divisionally by a plurality of number of times, the column amplifying circuit changes the amplification factor to amplify a signal output from the output circuit, the signal is A/D-converted by the A/D conversion circuit by a plurality of number of times, and the signal A/D-converted by a plurality of number of times is stored in the plurality of line memories, and the signal processing circuit controls the amplification factor of a signal amplifying circuit in accordance with that of the column amplifying circuit in order to adjust a plurality of output signals simultaneously read out from the plurality of line memories to have the same gradient, and comprises a linear conversion/synthesizing circuit which linearly converts optical input signal amounts to have the same gradient, and synthesizing them into one signal by a switching circuit.

According to another aspect of the invention, there is provided a solid-state image sensing device comprising: a pixel section having photodiodes two-dimensionally arrayed on a semiconductor substrate, a reading circuit which reads out signal charges from the photodiodes to detectors, a detection circuit which converts the signal charges into a voltage, an output circuit which outputs the voltage of the detection circuit, and a reset circuit which resets the detection circuit, an exposure time control circuit which controls an exposure time during which the photodiode performs photoelectric conversion, a storage circuit which stores a signal output from the output circuit, an A/D conversion circuit which A/D-converts a signal stored in the storage circuit, a plurality of line memories which store signals converted by the A/D conversion circuit, and a signal processing circuit which processes a plurality of output signals from the plurality of line memories, wherein the exposure time control circuit controls the exposure time, during which the photodiode performs photoelectric conversion, to be equal for all pixels, the A/D conversion circuit A/D-converts a signal output from the pixel section by changing the resolution of the input signal level, and the signal processing circuit controls the amplification factor of a signal amplifying circuit for a signal output from the line memory in accordance with the resolution of the A/D conversion circuit, and comprises a linear conversion circuit which linearly converts an optical input signal amount to have a linear gradient.

BRIEF DESCRIPTION OF THE SEVERAL VIEWS OF THE DRAWING

FIG. 2 is a circuit diagram showing a concrete arrangement of a pixel section, CDS, and ADC in the amplifier type CMOS image sensor according to the first embodiment of the present invention;

FIG. 11 is a block diagram showing the schematic arrangement of an amplifier type CMOS image sensor in order to explain a method of widening the dynamic range at low illuminance according to the third embodiment of the present invention;

FIG. 12 is a block diagram showing the schematic arrangement of an amplifier type CMOS image sensor in order to explain a method of widening the dynamic range at low illuminance according to the fourth embodiment of the present invention;

FIG. 15 is a block diagram showing the schematic arrangement of an amplifier type CMOS image sensor in order to explain a method of widening the dynamic range at low illuminance according to the sixth embodiment of the present invention;

FIG. 16 is a block diagram showing the schematic arrangement of an amplifier type CMOS image sensor in order to explain a method of widening the dynamic range at high illuminance according to the seventh embodiment of the present invention;

FIG. 21A is a block diagram showing the schematic arrangement of the WDM circuit according to the seventh embodiment of the present invention, and FIGS. 21B to 21D are graphs showing the operation;

FIG. 24 is a block diagram showing the schematic arrangement of an amplifier type CMOS image sensor in order to explain a method of widening the dynamic range from low to high illuminances according to the ninth embodiment of the present invention;

FIG. 33 is a block diagram showing the schematic arrangement of an amplifier type CMOS image sensor according to the 13th embodiment of the present invention;

DETAILED DESCRIPTION OF THE INVENTION

Embodiments will be described below with reference to the accompanying drawing.

Figure 1:
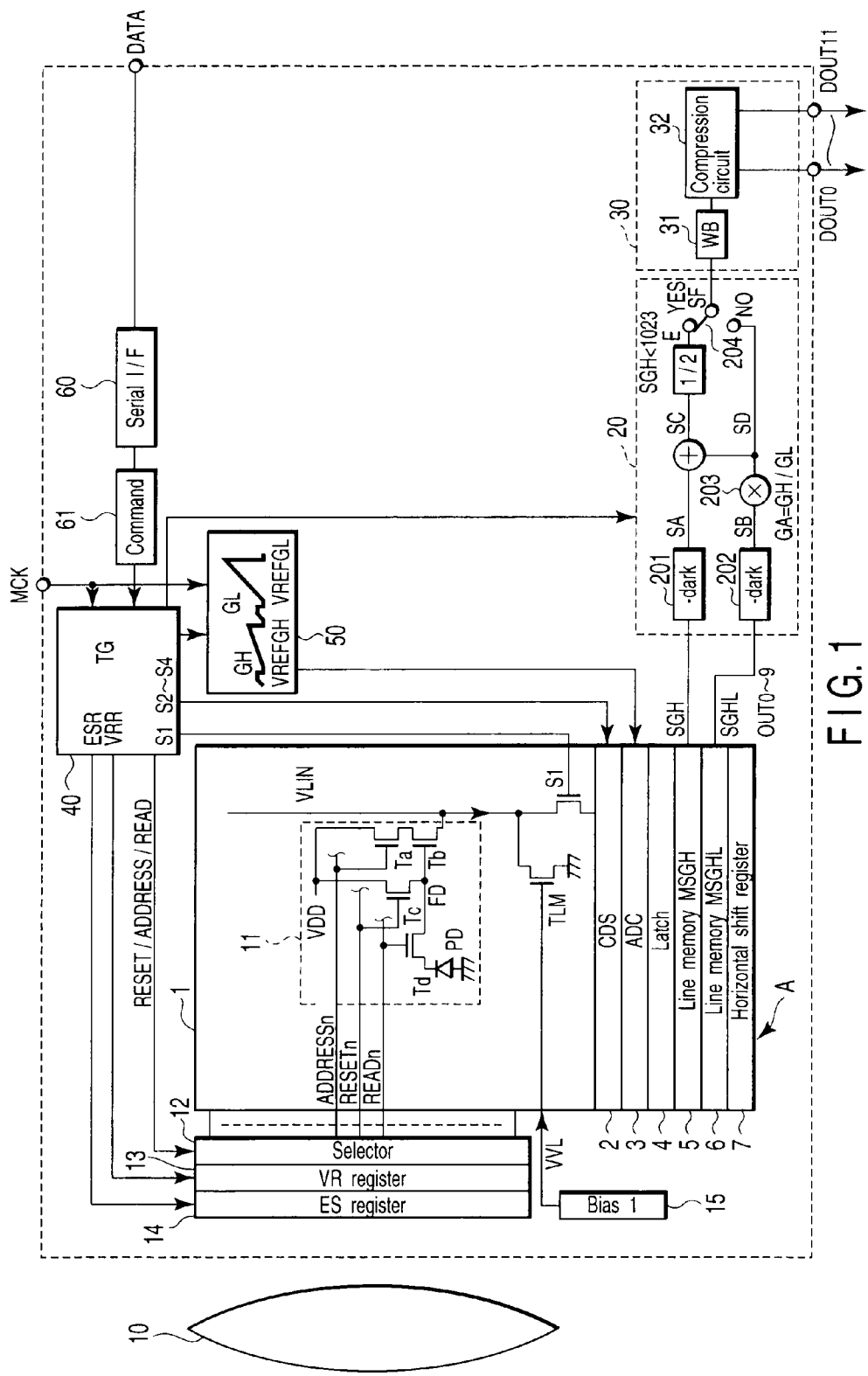
FIG. 1 is a block diagram showing the schematic arrangement of an amplifier type CMOS image sensor in order to explain a method of widening the dynamic range at low illuminance according to the first embodiment of the present invention.

FIG. 1 is a block diagram showing the schematic arrangement of an amplifier type CMOS image sensor in order to explain a method of widening the dynamic range at low illuminance according to the first embodiment of the present invention. A sensor core A comprises a pixel section 1, a column type noise canceling circuit (CDS) 2, a column type analog-to-digital converter (ADC) 3, a latch circuit 4, two line memories (MSGH and MSGHL) 5 and 6, and a horizontal shift register 7.

The pixel section 1 receives light via a lens 10, and generates charges corresponding to the incident light quantity by photoelectric conversion. In the pixel section 1, cells (pixels) 11 are two-dimensionally arrayed in rows and columns on a semiconductor substrate. One cell 11 has four transistors Ta, Tb, Tc, and Td and a photodiode PD. Each cell 11 receives pulse signals ADDRESSn, RESETn, and READn. Underneath the pixel section 1, load transistors TLM for a source follower circuit are arranged along the horizontal direction. One end of the current path of each load transistor TLM is connected to a corresponding vertical signal line VLIN, and its other end is grounded. The vertical signal line VLIN is connected to the CDS 2 via a switch S1.

An analog signal corresponding to signal charges generated in the pixel section 1 is supplied to the ADC 3 via the CDS 2. The analog signal is converted into a digital signal by the ADC 3, and the digital signal is latched by the latch circuit 4. Digital signals latched by the latch circuit 4 are sequentially read out by the horizontal shift register 7 from the sensor core A via the line memories (MSGH and MSGHL) 5 and 6. Digital signals OUT0 to OUT9 read out from the line memories (MSGH and MSGHL) 5 and 6 are supplied to a wide dynamic range mixing (WDM) circuit 20. The WDM circuit 20 synthesizes two signals and outputs the synthesized signal outside the sensor via a subsequent wide dynamic range compressor (WDC) circuit 30.

A pulse selector circuit (selector) 12, signal reading vertical register (VR register) 13, and storage time control vertical register (ES register) 14 are arranged adjacent to the pixel section 1.

Reading from the pixel section 1 and control of the CDS 2 are executed in synchronism with pulse signals S1 to S4, RESET/ADDRESS/READ, VRR, and ESR which are output from a timing generator (TG) 40. The pulse signals S2 to S4 are supplied to the CDS 2. The pulse signal RESET/ADDRESS/READ is supplied to the pulse selector circuit 12.

The pulse signal VRR is supplied to the VR register 13, and the pulse signal ESR is supplied to the ES register 14. These registers select a vertical line in the pixel section 1, and the pulse signal RESET/ADDRESS/READ (typified by RESETn, ADDRESSn, and READn in FIG. 1) is supplied to the pixel section 1 via the pulse selector circuit 12. The pulse signal (address pulse) ADDRESSn is supplied to the gate of the row selection transistor Ta in the cell 11. The pulse signal (reset pulse) RESETn is supplied to the gate of the reset transistor Tc in the cell 11. The pulse signal (read pulse) READn is supplied to the gate of the read transistor Td in the cell 11. The pixel section 1 receives a bias voltage VVL from a bias generation circuit (bias 1) 15. The bias voltage VVL is applied to the gate of the load transistor TLM for the source follower circuit.

A VREF generation circuit 50 operates in response to a main clock signal MCK, and generates a reference waveform for A/D conversion (ADC). The amplitude of the reference waveform is controlled by data DATA input to a serial interface (serial I/F) 60. A command input to the serial interface 60 is supplied to a command decoder 61, decoded by it, and supplied to the timing generator 40 together with the main clock signal MCK.

The VREF generation circuit 50 generates triangular waves VREFGH and VREFGL and supplies them to the ADC 3 in order to execute A/D conversion twice during one horizontal scan period. By setting the former VREF amplitude to a gradient GH, a signal range having a low input signal level is A/D-converted to 10 bits, i.e., 1023 levels. That is, the same effect as that of amplifying the analog GAIN can be obtained. By setting the latter VREF amplitude to a gradient GL, a signal range having a large input is A/D-converted to 10 bits, i.e., 1023 levels. That is, the same effect as that of decreasing the analog GAIN can be obtained. For example, if the VREFGL amplitude is set to 480 mV, 1023 LSB level of 10-bit data corresponding to the 480 mV input signal can be obtained. If the VREFGH amplitude is set to 120 mV, 1023 LSB level of 10-bit data corresponding to the 120 mV input signal can be obtained. In other words, this yields the same effect as that of quadrupling the analog GAIN. Conventionally at 4× GAIN setting in low-illuminance image sensing, the VREF amplitude is set to 120 mV, and no input signal larger than 120 mV is used.

The wide dynamic range mixing (WDM) circuit 20 comprises subtracting circuits (−dark) 201 and 202 which subtract a dark signal at black level, a gain circuit (GA) 203 which amplifies an output from the subtracting circuit 202, and a switch 204. The output side of the wide dynamic range mixing (WDM) circuit 20 is connected to the wide dynamic range compressor (WDC) circuit 30 having a white balance processing circuit (WB) 31 and compression circuit 32.

Signals SGH and SGHL which are stored in the line memories 5 and 6 and for which the analog GAIN is multiplied by four and one are simultaneously read out from the line memories 5 and 6, and input to the WDM circuit 20. The subtracting circuit 201 subtracts 64 LSB of black level (dark) from the signal SGH, generating a signal SA. Similarly, the subtracting circuit 202 subtracts 64 LSB of black level (dark) from the signal SGHL, generating a signal SB. The gain circuit (GA) 203 amplifies the signal SB, generating a signal SD. The gain amount is set to the analog GAIN ratio GH/GL of the signals SGH and SGHL. By amplifying the signal SB by the gain, even a photoelectric conversion characteristic curve having a different gradient can be equivalently converted into a curve having the same gradient as the signal SGH. The WDM circuit 20 generates a signal SC by adding the signals SD and SA in order to reduce noise at a low signal level. Since the signal level of the signal SC is doubled as a result of addition, it is halved at the subsequent stage to generate a signal SE. This process can reduce noise by 3 dB. The switch 204 is switched (by a determination circuit: not shown) to select, as a signal SF, the signal SE when the signal SGH is smaller than 1023 LSB level, and the signal SD when the signal SGH is equal to or larger than 1023 LSB level. As a result, the signal SE and the signal SD amplified by the GAIN can be smoothly synthesized, obtaining, as the signal SF, a signal which changes linearly with respect to an optical input signal. The WDM circuit 20 increases the number of bits to output a 16-bit signal at maximum. The white balance (WB) processing circuit 31 equalizes the R, G, and B signal levels so that the compression circuit 32 can compress the signal to a 12-bit signal and output it. A conventional image sensor does not use a signal larger than 120 mV. To the contrary, the image sensor according to the embodiment can effectively reproduce a signal up to the 480 mV saturation signal level of the sensor, widening the dynamic range.

FIG. 2 is a circuit diagram showing a concrete arrangement of the pixel section 1, CDS 2, and ADC 3 in the amplifier type CMOS image sensor shown in FIG. 1. Each cell (pixel) 11 in the pixel section 1 includes the row selection transistor Ta, amplifier transistor Tb, reset transistor Tc, read transistor Td, and photodiode PD. The current paths of the transistors Ta and Tb are series-connected between a power supply VDD and the vertical signal line VLIN. The gate of the transistor Ta receives the pulse signal ADDRESSn. The current path of the transistor Tc is connected between the power supply VDD and the gate (detector FD) of the transistor Tb. The gate of the transistor Tc receives the pulse signal RESETn. One end of the current path of the transistor Td is connected to the detector FD, and its gate receives the pulse signal READn. The other end of the current path of the transistor Td is connected to the cathode of the photodiode PD. The anode of the photodiode PD is grounded.

The pixel section 1 is configured by two-dimensionally arraying the cells 11 each having this structure in rows and columns. Underneath the pixel section 1, the load transistors TLM for the source follower circuit are arranged along the horizontal direction. The current path of each load transistor TLM is connected between the vertical signal line VLIN and ground, and its gate receives the bias voltage VVL from the bias generation circuit 15. The CDS 2 and ADC 3 comprise capacitors C1 and C2 for a noise canceller. In addition, the CDS 2 and ADC 3 comprise transistors TS1 for transferring signals from the vertical signal lines VLIN, transistors TS2 for inputting a reference waveform for A/D conversion, and comparator circuits COMP1 and COMP2 at two stages. Capacitors C3 are connected between the comparator circuits COMP1 and COMP2.

Each comparator circuit COMP1 includes an inverter INV1, and a transistor TS3 whose current path is connected between the input and output terminals of the inverter INV1. Each comparator circuit COMP2 includes an inverter INV2, and a transistor TS4 whose current path is connected between the input and output terminals of the inverter INV2. The timing generator 40 supplies the pulse signal S1 to the gate of the transistor TS1, the pulse signal S2 to that of the transistor TS2, the pulse signal S3 to that of the transistor TS3, and the pulse signal S4 to that of the transistor TS4. A digital signal output from the comparator circuit COMP2 is latched by the latch circuit 4, and input to the two line memories 5 and 6. Line memory signals operate the shift register 7 to sequentially output 10-bit digital signals OUT0 to OUT9 from the two line memories 5 and 6.

In this arrangement, for example, to read out a signal from an nth vertical signal line VLIN, the pulse signal ADDRESSn is set to "H" level to operate the source follower circuits each made up of the amplifier transistor Tb and load transistor TLM. Then, signal charges obtained by photoelectric conversion by the photodiodes PD are stored for a predetermined period. To remove a noise signal such as a dark current at the detector FD before reading, the pulse signal RESETn is set to "H" level to turn on the transistor Tc and set the detector FD to the VDD voltage=2.8V. Then, a reference voltage (reset level) in a state in which no signal exists at the detector FD is output to the vertical signal line VLIN. At this time, the pulse signals S1, S3, and S4 are set to "H" level to turn on the transistors TS1, TS3, and TS4. In response to this, the A/D conversion levels of the comparator circuits COMP1 and COMP2 in the ADC 3 are set. The capacitor C1 stores charges by an amount corresponding to the reset level of the vertical signal line VLIN.

After that, the pulse signal (read pulse) READn is set to "H" level to turn on the read transistor Td, and signal charges generated and stored in the photodiode PD are read out to the detector FD. As a result, the voltage (signal+reset) level of the detector FD is read out to the vertical signal line VLIN. At this time, the pulse signal S1 is set to "H" level, the pulse signal S3 is set to "L" level, the pulse signal S4 is set to "L" level, and the pulse signal S2 is set to "H" level. Then, the transistor TS1 is turned on, the transistor TS3 is turned off, the transistor TS4 is turned off, and the transistor TS2 is turned on. The capacitor C2 stores charges corresponding to "the signal of the vertical signal line VLIN+reset level". The capacitor C1 keeps holding the reset level because the input terminal of the comparator circuit COMP1 is at high impedance.

Thereafter, the level of the reference waveform output from the VREF generation circuit 50 is raised (the triangular wave VREF is changed from low level to high level). The comparator circuits COMP1 and COMP2 execute A/D conversion via the combined capacitance of the capacitors C1 and C2. The triangular wave is generated using 10 bits (0 to 1023 levels). A 10-bit counter determines the A/D conversion level, and the latch circuit 4 latches data. After the A/D conversion on 1023 levels, data in the latch circuit 4 is transferred to the line memories 5 and 6. The reset level held in the capacitor C1 is opposite in polarity to the reset level held in the capacitor C2. Thus, the reset level is canceled, and A/D conversion is executed substantially by the signal component of the capacitor C2. The operation to remove the reset level is called a noise reduction operation (CDS operation: Correlated Double Sampling). To execute the A/D conversion operation twice during one horizontal scan period, the VREF generation circuit 50 generates the triangular waves VREFGH and VREFGL, and supplies them to one end of the current path of the transistor TS2. The line memory MSGH 5 holds a digital signal A/D-converted by the former VREFGH. The line memory MSGHL 6 holds a digital signal A/D-converted by the latter VREFGL. These two signals are simultaneously read out in the next horizontal scan period.

Figure 3:
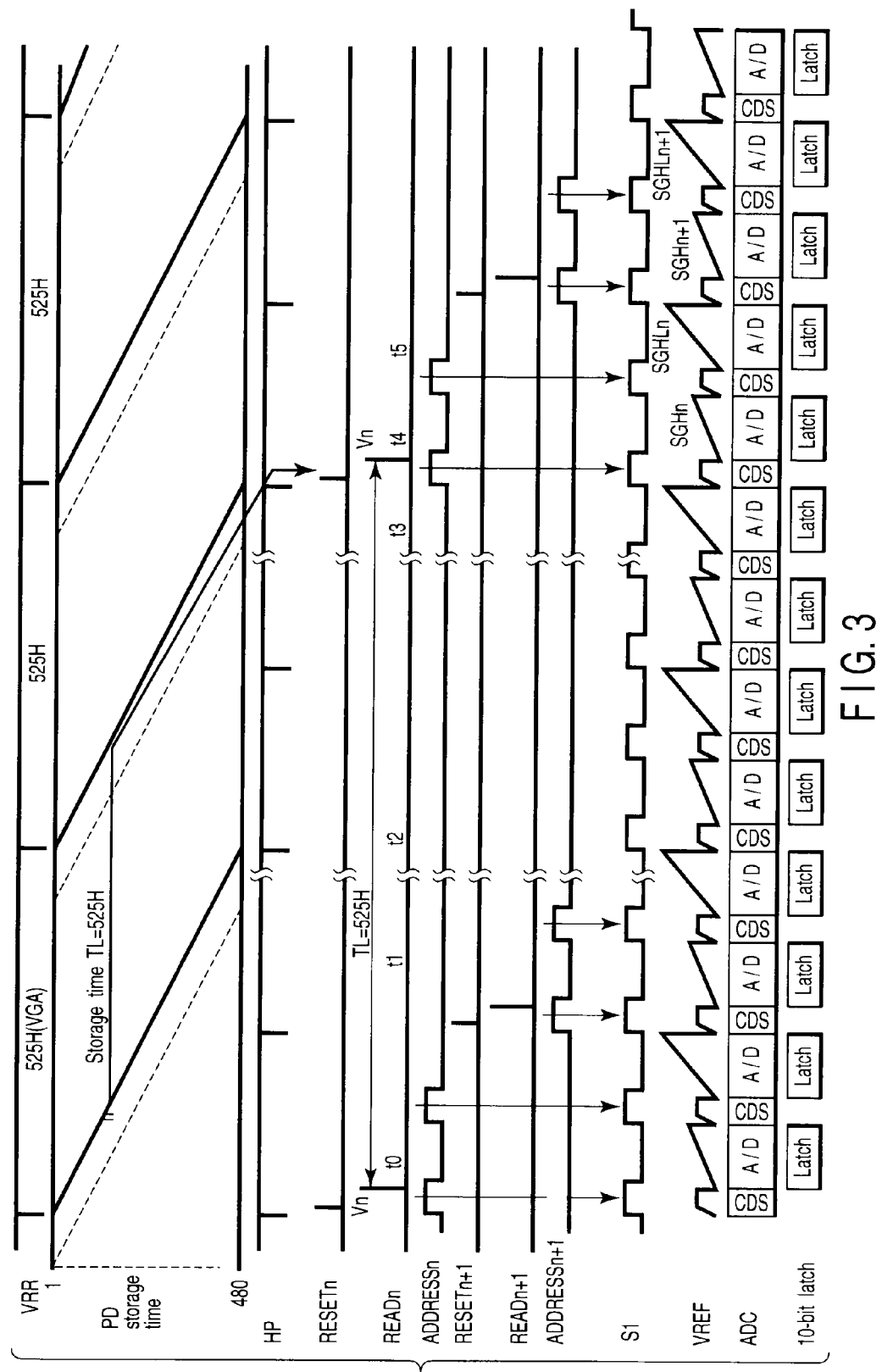
FIG. 3 is a waveform chart showing the first operation timing of the CMOS image sensor according to the first embodiment of the present invention.

FIG. 3 is a waveform chart showing the first operation timing of the CMOS image sensor shown in FIG. 1. This sensor has the number of pixels for VGA. In this example, the storage time during which charges obtained by photoelectric conversion by the photodiodes PD on n vertical lines are stored is set to a maximum storage time TL=525 H for low-illuminance shooting. The photodiodes PD photoelectrically convert optical signals and store signal charges. The amplitude of the read pulse READ is controlled to high level (2.8V). The storage time TL can be controlled for each 1 H by the ES register 14. Although the storage time TL can be controlled for each 1 H by the ES register 14, it can also be controlled for each 1 H or shorter by changing the input pulse position of the selector circuit 12.

In the first read operation (t4) from the pixel section 1, the pulse signals RESETn, READn, and ADDRESSn are supplied to the pixel section 1 in synchronism with a horizontal sync pulse HP to read out signal charges photoelectrically converted and stored in the photodiode PD. First, the capacitor C1 in FIG. 2 receives a reset level obtained when enabling and then disabling RESETn. This reading is done by setting the amplitude of the reference waveform to an intermediate level. The intermediate level is automatically adjusted within the sensor so as to set the light-shielded pixels (OB) of the pixel section 1 to 64 LSB. Then, READn is enabled to output a signal. The capacitor C2 in FIG. 2 holds a signal obtained by adding the signal component of the readout signal and the reset level. A triangular wave GH is generated as a reference waveform during the former 0.5 H period of the horizontal scan period, executing 10-bit A/D conversion. The A/D-converted signal (digital data) is latched by the latch circuit 4, and input to the line memory MSGH 5 after the end of A/D conversion.

In the second read operation (t5) from the pixel section 1, only the pulse signal ADDRESSn is supplied to the pixel section 1 after the 0.5 H first read operation without supplying the pulse signals RESETn and READn. The capacitor C2 in FIG. 2 receives and holds again a signal obtained by adding the signal level and the reset level held in the detector FD. As the reset level of the capacitor C1, the signal held at the former t4 is used. A triangular wave GL is generated as a reference waveform during the latter 0.5 H period of the horizontal scan period, executing 10-bit A/D conversion. The A/D-converted signal is latched by the latch circuit 4, and input to the line memory MSGHL 6 after the end of A/D conversion. In the next horizontal scan period, the signals are simultaneously output from the two line memories MSGH and MSGHL 5 and 6. The WDM circuit 20 synthesizes the signals of each pixel. As shown in FIG. 1, the wide dynamic range mixing (WDM) circuit 20 linearly converts and synthesizes the two signals to generate a 16-bit signal at maximum. In the subsequent WDC circuit 30, the white balance circuit 31 equalizes the R, G, and B signal levels in shooting a white object. Then, the compression circuit 32 compresses the highlight component of the 16-bit signal into a 12-bit signal, outputting the compressed signal from the sensor.

Since the signal of the detector FD is output again in the second half of the horizontal scan period, KTC noise generated by the switch S1, thermal noise generated by the source follower, and random noise such as 1/f noise can be reduced. Since the WDM circuit 20 in FIG. 1 adds a low signal level, noise can be reduced by 3 dB.

Figure 4:
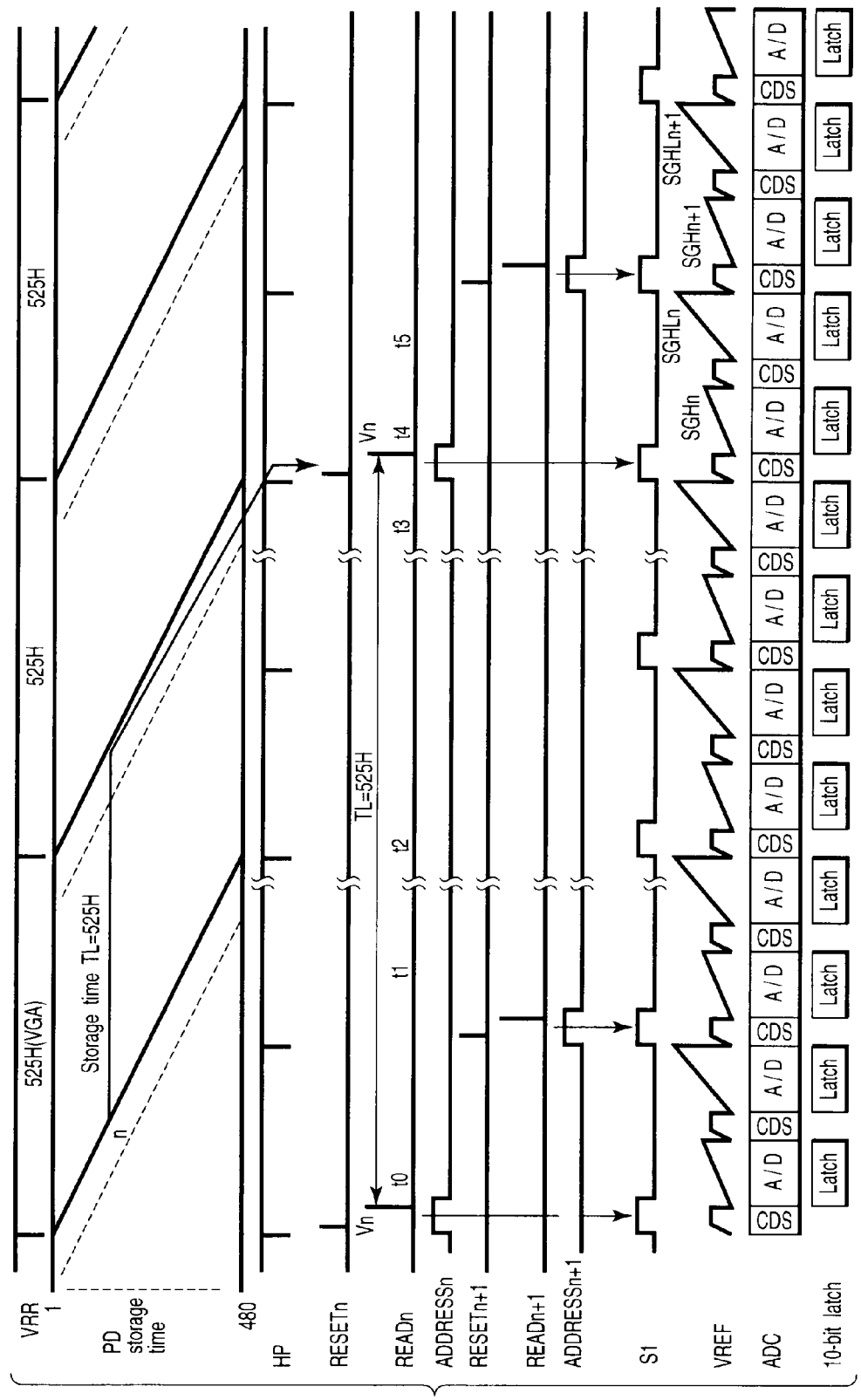
FIG. 4 is a waveform chart showing the second operation timing of the CMOS image sensor according to the first embodiment of the present invention.

FIG. 4 shows the second operation timing. This operation timing is different from that in FIG. 3 in that the pulse ADDRESSn is disabled at time t5 and A/D conversion is done using again signals stored in the capacitors C1 and C2 in FIG. 2 without outputting the signal of the detector FD. Noise mixed by the A/D conversion operation can be reduced using the WDM circuit 20 in FIG. 1.

Figure 5:
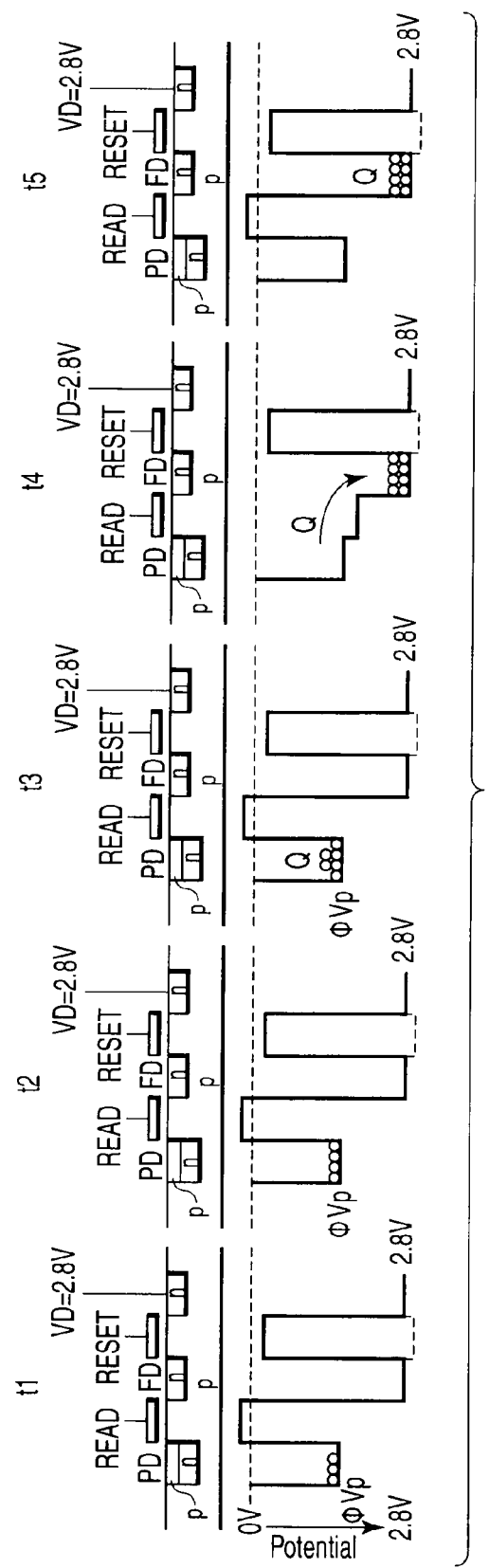
FIG. 5 is a view showing the section and potential of a cell in the pixel section according to the first embodiment of the present invention.

FIG. 5 is a view showing the section and potential of the cell 11 in the pixel section 1 at times t1 to t5 in the operation timing charts shown in FIGS. 3 and 4.

The photodiode PD is formed by forming an n-type impurity diffusion region in a p-type semiconductor substrate. The surface of the n-type impurity diffusion region is shielded with a p-type impurity diffusion region. This structure provides a buried photodiode PD almost free from scratches and nonuniformities in a dark environment. The detector FD is formed in an n-type impurity diffusion region. Together with the n-type impurity diffusion region of the photodiode PD, the n-type impurity diffusion region of the detector FD functions as the source and drain regions of the read transistor (read gate) Td. A polysilicon gate electrode is formed on a gate insulating film (not shown) on the substrate between these n-type impurity diffusion regions. The gate electrode receives the read pulse READ. An n-type impurity diffusion region is formed adjacent to that of the detector FD. This n-type impurity diffusion region functions as the drain region of the reset transistor (reset gate) Tc, and that of the detector FD functions as its source region. A drain voltage VD (=2.8V, e.g., VDD) is applied to the drain region. A polysilicon gate electrode is formed on a gate insulating film (not shown) on the substrate between these n-type impurity diffusion regions. The gate electrode receives the reset pulse RESET. The reset transistor Tc can reset the detector FD to the drain voltage VD.

From time to, the PD photoelectrically converts an optical input signal and starts storing signal charges. The storage operation continues at times t1, t2, and t3. At time t4, in order to read out the signal stored in the photodiode PD, the pulse RESET is applied to reset the detector FD to the potential of the power supply voltage VD. Then, a voltage Vn is applied to the READ electrode to read out all signal charges from the PD to the detector FD. At time t5, neither the pulse RESET nor READ is applied, so the detector FD keeps holding the signal charges Q read out at time t4.

Figure 6:
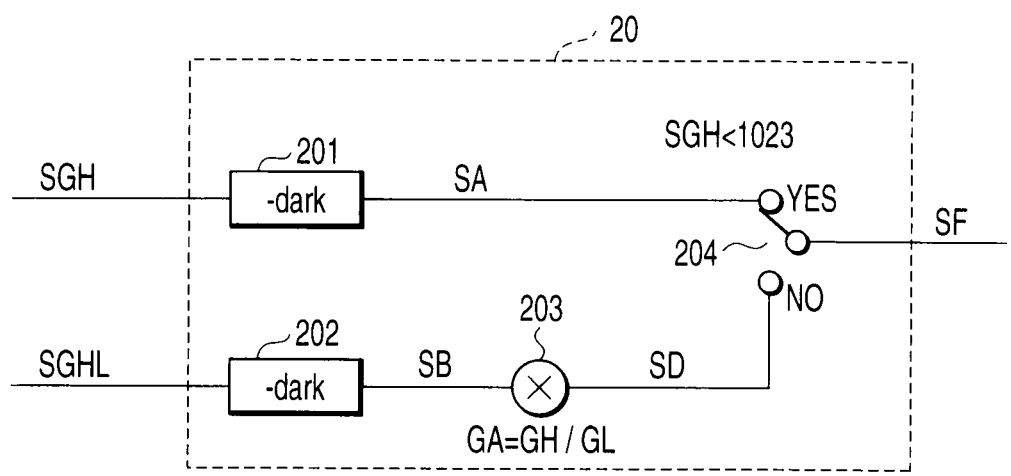
FIG. 6 is a circuit diagram showing another arrangement of a WDM circuit according to the first embodiment of the present invention.

FIG. 6 shows another arrangement of the WDM circuit 20. First, the subtracting circuit 201 generates the signal SA by subtracting 64 LSB of black level (dark) from the signal SGH. Similarly, the subtracting circuit 202 generates the signal SB by subtracting 64 LSB of black level (dark) from the signal SGHL. Then, the gain circuit (GA) 203 generates the signal SD by amplifying the signal SB. The switch 204 is switched by the determination circuit (not shown) to select, as the signal SF, the signal SA when the signal SGH is smaller than 1023 LSB level, and the signal SD when the signal SGH is equal to or larger than 1023 LSB level. As a result, the signal SA and the signal SD amplified by the GAIN can be smoothly synthesized, obtaining, as the signal SF, a signal which changes linearly to an optical input signal.

Figure 7A:
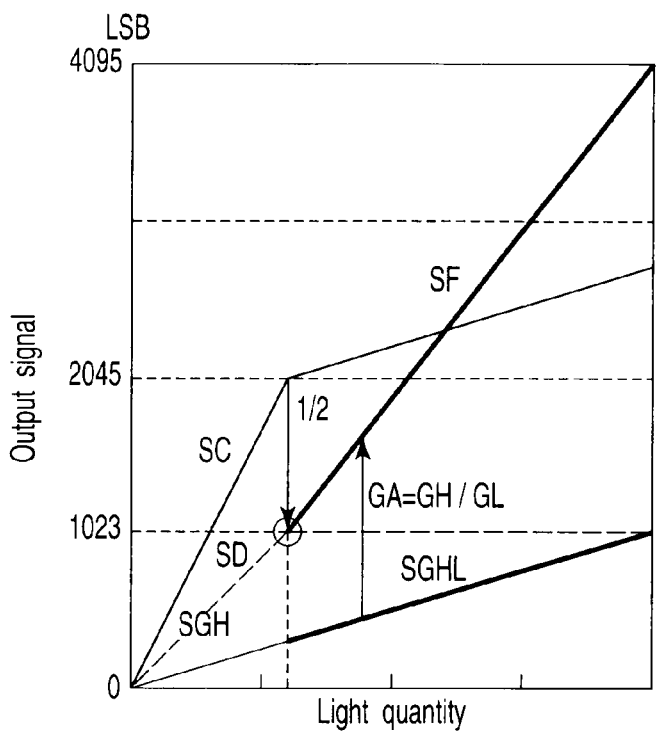
FIGS. 7A and 7B are graphs showing the operation of the WDM circuit according to the first embodiment of the present invention.

FIG. 7A shows the operation of the WDM circuit 20 in FIG. 1. For descriptive convenience, the black level (dark) is set to 0 LSB. Since the signal SD is generated by quadrupling the signal SGHL, its gradient coincides with that of the signal SGH. Since the signal SC is generated by adding the signals SA and SD, its gradient is doubled. Since the GAIN of the signal SE is set to ½, its gradient is the same as that of the SGH signal. After the signal SGH is saturated at 1023 LSB level, the signal SF is generated by switching the signal SGH to, as a signal larger than 1023 LSB level, the signal SD prepared by quadrupling the signal SGHL. The signal SF widens the dynamic range by about four times in comparison with the conventional signal SGH. At a level lower than 1023 LSB level, noise can be reduced by about 3 dB.

Figure 7B:
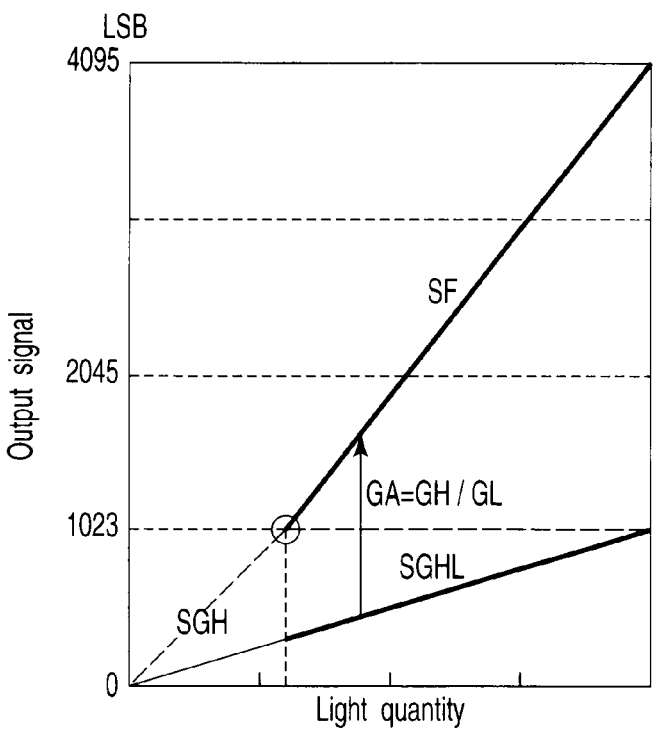

FIG. 7B shows the operation of the WDM circuit 20 in FIG. 6. Since the GAIN of the signal SGH is four times larger than that of the signal SGHL, its gradient is four times larger. After the signal SGH is saturated at 1023 LSB level, the signal SF is generated by switching the signal SGH to, as a signal larger than 1023 LSB level, the signal SD prepared by quadrupling the signal SGHL. The signal SF can widen the dynamic range by about four times in comparison with the conventional signal SGH.

Figure 8:
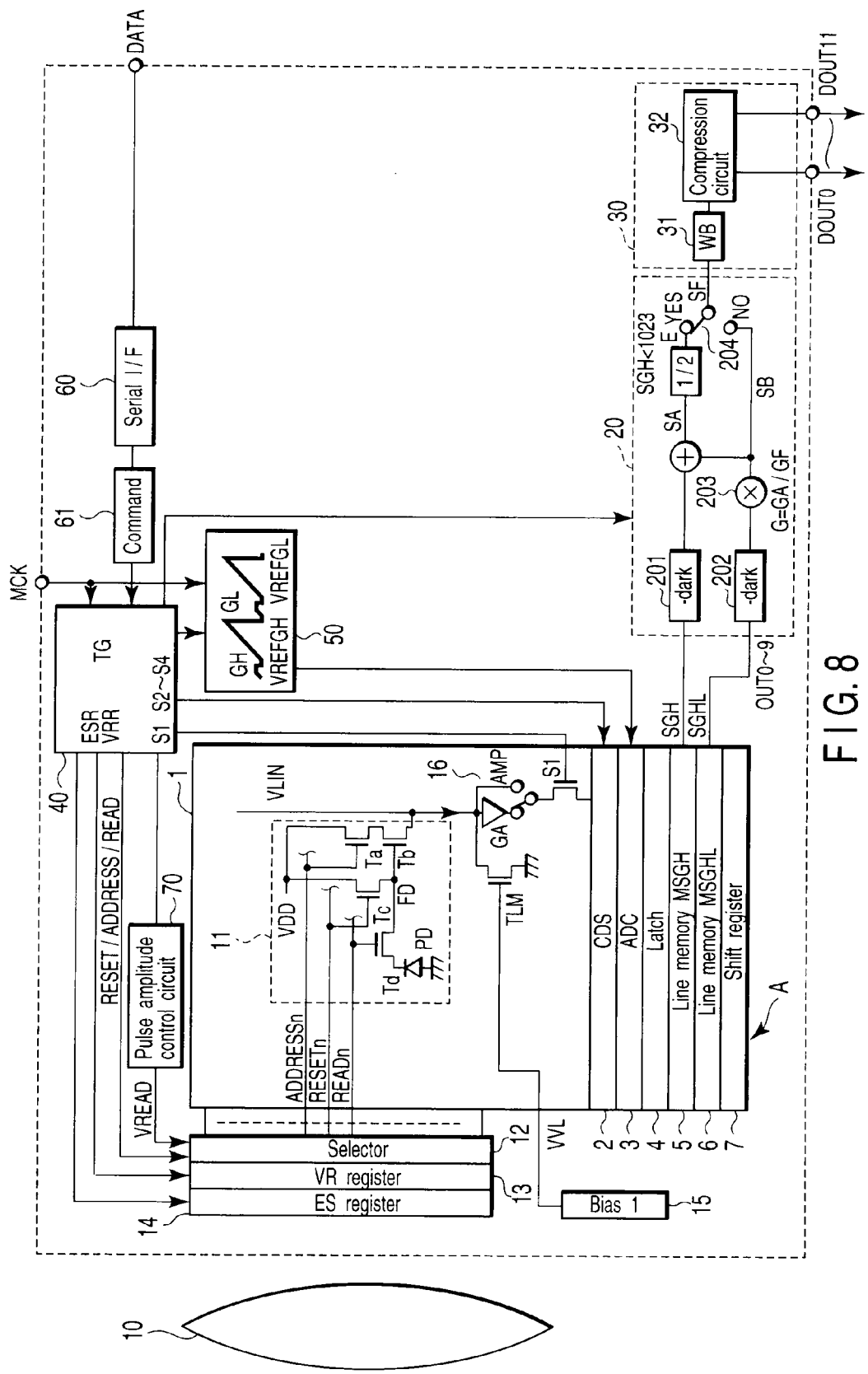
FIG. 8 is a block diagram showing the schematic arrangement of an amplifier type CMOS image sensor in order to explain a method of widening the dynamic range at low illuminance according to the second embodiment of the present invention.

FIG. 8 is a block diagram showing the schematic arrangement of an amplifier type CMOS image sensor in order to explain a method of widening the dynamic range at low illuminance according to the second embodiment of the present invention. In FIG. 8, the same reference numerals as those in FIG. 1 denote the same parts.

In FIG. 8, unlike FIG. 1, the former VREF amplitude of a VREF circuit 50 is set to the same gradient GL as that of the latter one. In a sensor core A, a column amplifier AMP 16 is interposed between a vertical signal line VLIN and a switch S1. The GAIN is multiplied by four in the first half of the horizontal scan period, and by one in the second half. This arrangement can reduce the noise mixing amount after the switch S1 to 1/GAIN. The column amplifier AMP 16 may be an inverter AMP for the source follower. The column amplifier AMP 16 may be of an inversion type. In this case, for example, the waveform VREF needs to be inverted. A timing generator 40 supplies a signal to a pulse amplitude control circuit 70. The pulse amplitude control circuit 70 controls the amplitude of the pulse READn to generate a ternary pulse signal VREAD and supply it to a selector 12. Using the ternary signal, a signal is divided into two and read out from a photodiode PD.

Figure 9:
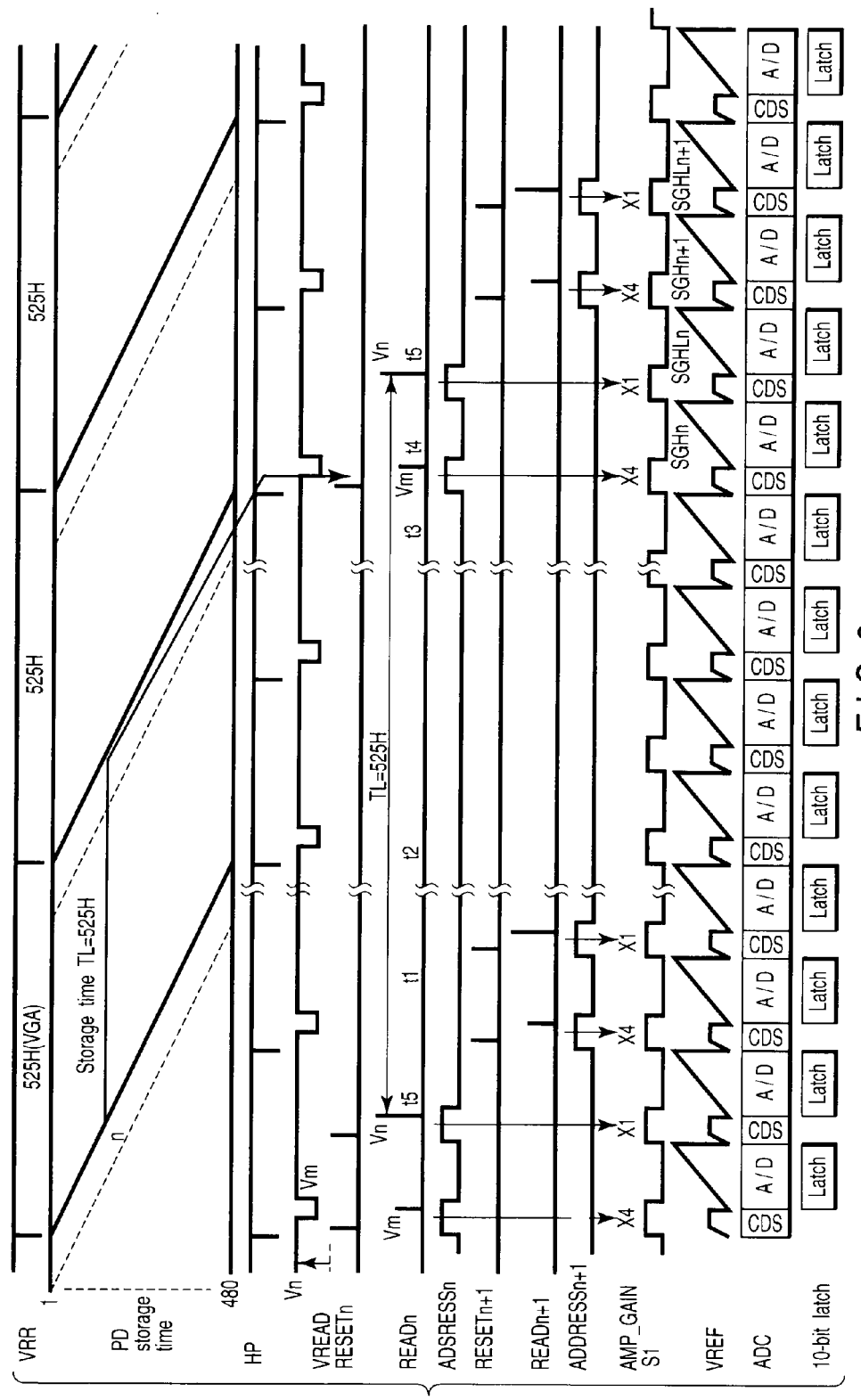
FIG. 9 is a waveform chart showing the operation timing of the CMOS image sensor according to the second embodiment of the present invention.

FIG. 9 shows an operation timing. The storage time TL=525 H, and the photodiode PD stores signal charges. At time t4, the pulse READn having an intermediate voltage Vm is applied to read out some signal charges to a detector FD. A/D conversion is executed by quadrupling the GAIN of the column AMP 16, and a signal SGH is output from a latch circuit 4 to a line memory 5. At time t5 in the second half of one horizontal scan period, the detector FD is reset by RESETn, and READn is set to the high voltage Vn, reading out all the remaining signal charges. At this time, the GAIN of the column AMP 16 is reset to 1x. The A/D-converted signal is stored as a signal SGHL in a line memory 6 via the latch circuit 4.

Figure 10:
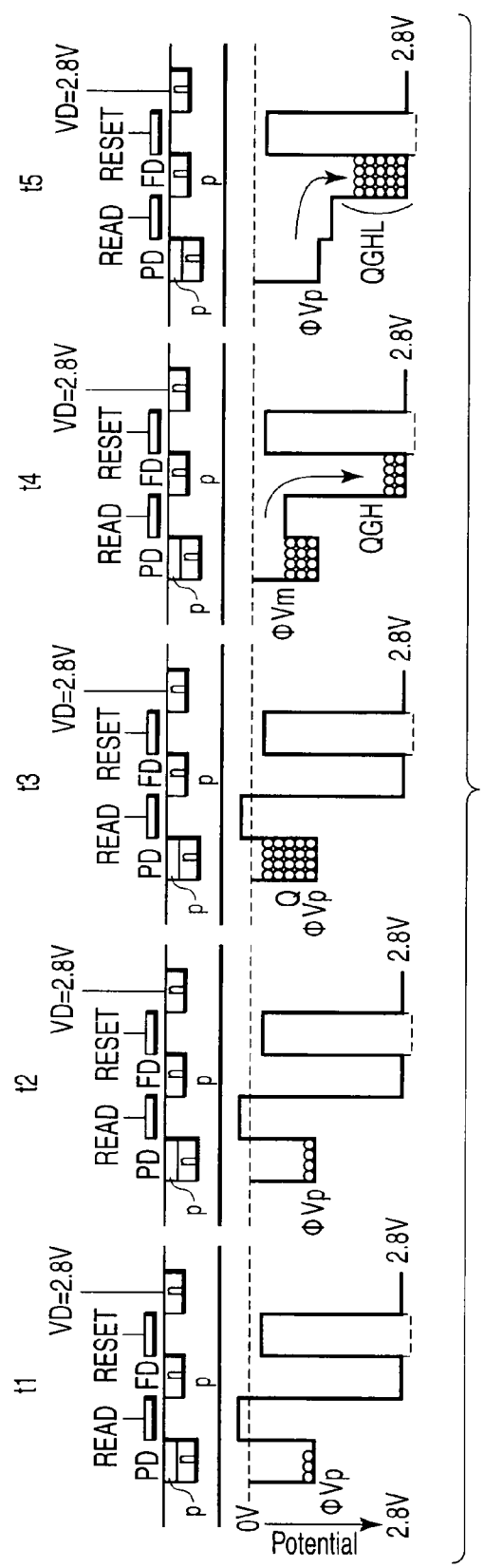
FIG. 10 is a view showing the section and potential of a cell in a pixel section according to the second embodiment of the present invention.

FIG. 10 is a potential view. At time t4, the READ voltage is set to Vm, and a signal QGH of signal charges larger than a potential ΦVm is read out to the detector FD. At time t5, the remaining signal charges are read out to the detector FD, and a signal obtained by adding the signal charges and the signal QGH is output as QGHL.

FIG. 11 is a block diagram showing the schematic arrangement of an amplifier type CMOS image sensor in order to explain a method of widening the dynamic range at low illuminance according to the third embodiment of the present invention. In FIG. 11, the same reference numerals as those in FIG. 1 denote the same parts.

In FIG. 11, unlike FIG. 1, the latter VREFGL waveform of a VREF circuit 50 is set to the same gradient GH as that of VREFGH. A signal obtained by VREFGL is stored in a line memory MSGHL 6, and output as a signal SGHL from a sensor core A. A WDM circuit 20 adds signals SA and SB from which the black level (dark) is simply subtracted, and halves the signal level. Thus, the number of bits does not increase, and the signal SF becomes a 10-bit signal. Further, similar to FIG. 1, random noise can be reduced by 3 dB. If the WDM circuit 20 does not halve the signal level, an 11-bit signal SF is generated. The signal read timing is as shown in FIG. 3 or 4.

FIG. 12 is a block diagram showing the schematic arrangement of an amplifier type CMOS image sensor in order to explain a method of widening the dynamic range at low illuminance according to the fourth embodiment of the present invention. In FIG. 12, the same reference numerals as those in FIG. 1 denote the same parts.

In FIG. 12, unlike FIG. 1, a VREF circuit 50 uses one waveform VREF. The CMOS image sensor has only one line memory 51. The VREF circuit 50 generates the waveform VREF as a polygonal line having two gradients. The waveform VREF has a gradient GH up to 511 LSB and a gradient GL after a point KP. A signal SGHL output from a sensor core A is input to a WDM circuit 20. In the WDM circuit 20, an amplifier circuit 205 amplifies, by GA, a signal larger than the point KP of the waveform VREF. The amplification factor is calculated by the gradient ratio GH/GL of the waveform VREF. The waveform is made linear by switching the signal by a switching circuit 204 to a signal SA when the signal is larger than the KP level, and the signal SGHL when it is smaller than the KP level. After that, a subtracting circuit 206 subtracts the black level (dark), generating a signal SF.

Figure 13:
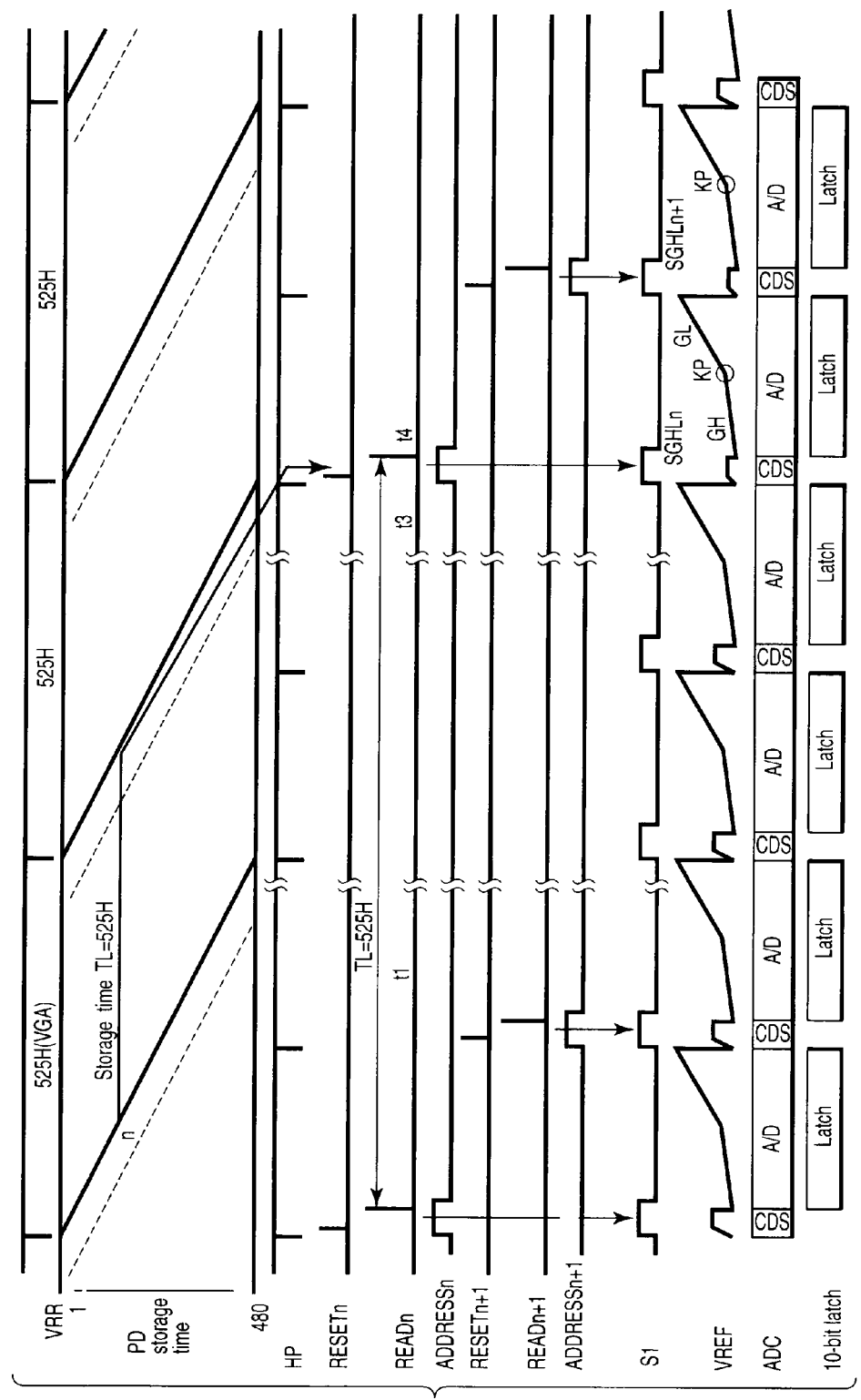
FIG. 13 is a waveform chart showing the operation timing of the CMOS image sensor according to the fourth embodiment of the present invention.

FIG. 13 is an operation timing chart. The storage time TL=525 H, and a photodiode PD stores signal charges. At time t4, the pulse READn is applied to read out all signal charges to a detector FD. The signal is A/D-converted and output as the signal SGHL. The waveform VREF at this time first rises with GH, and its gradient changes to GL at the point KP. The gradient GH increases the resolution of a low signal level, attaining a state in which apparently the analog GAIN is increased. The gradient GL attains a state in which the analog GAIN is decreased.

Figure 14:
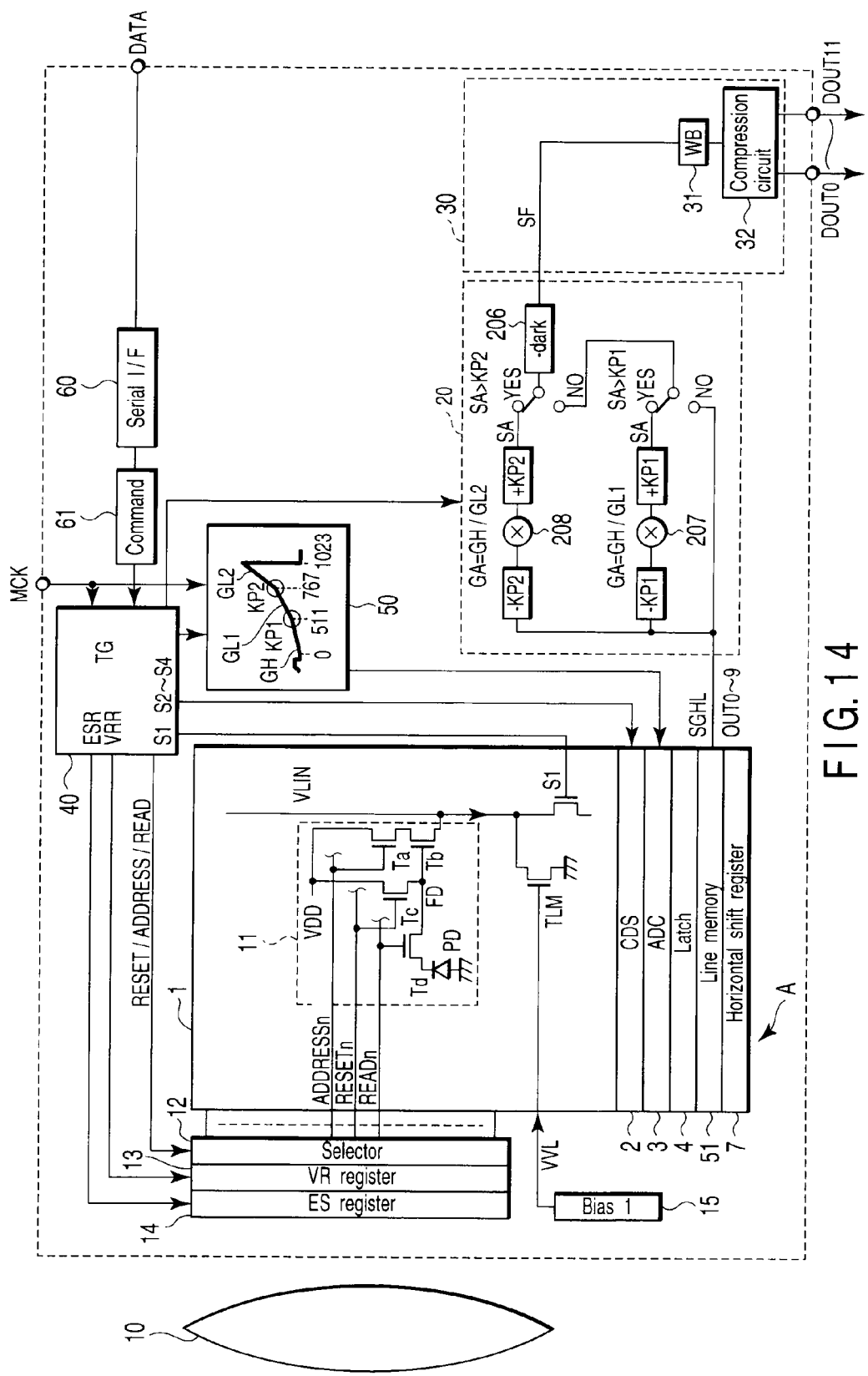
FIG. 14 is a block diagram showing the schematic arrangement of an amplifier type CMOS image sensor in order to explain a method of widening the dynamic range at low illuminance according to the fifth embodiment of the present invention.

FIG. 14 is a block diagram showing the schematic arrangement of an amplifier type CMOS image sensor in order to explain a method of widening the dynamic range at low illuminance according to the fifth embodiment of the present invention. In FIG. 14, the same reference numerals as those in FIG. 1 denote the same parts.

In FIG. 14, unlike FIG. 12, a VREF circuit 50 generates the waveform VREF as a polygonal line having three gradients. The waveform VREF has a gradient GH up to 511 LSB at a point KP1, a gradient GL1 up to 767 LSB at a point KP2, and a gradient GL2 up to 1023 LSB. In a WDM circuit 20, an amplifier circuit 207 amplifies a signal larger than the point KP1 of the waveform VREF by GA, generating a signal SA. An amplifier circuit 208 amplifies a signal larger than the point KP2 by GB, generating a signal SB. The WDM circuit 20 generates a signal SF by switching the signal between the signals SGHL, SA, and SB at KP1 and KP2 and linearly converting the signal.

FIG. 15 is a block diagram showing the schematic arrangement of an amplifier type CMOS image sensor in order to explain a method of widening the dynamic range at low illuminance according to the sixth embodiment of the present invention. In FIG. 15, the same reference numerals as those in FIG. 1 denote the same parts.

In FIG. 15, unlike FIG. 14, the waveform VREF is generated with a curve gradient GC which changes smoothly, unlike a polygonal line having three gradients. This gradient increases gradually in accordance with the counter value. Apparently, the GAIN is large for a small input signal and small for a large signal. In a WDM circuit 20, the GAIN curve of an amplifier circuit (GC1) 209 is set to GC1 in FIG. 15 in correspondence with the curve GC of the waveform VREF. As an input signal SGHL increases, the GAIN increases. The amplifier circuit 209 outputs a linear signal SE with respect to the input signal. The signal is linearly converted into a 12-bit output which is four times larger than a conventional 10-bit output. That is, the dynamic range is widened to four times the conventional one. The gradient GC can be freely set. In general, an input signal is converted by squaring it, multiplying it by a coefficient such as the reciprocal of a power, or creating a table.

FIG. 16 is a block diagram showing the schematic arrangement of an amplifier type CMOS image sensor in order to explain a method of widening the dynamic range at high illuminance according to the seventh embodiment of the present invention. In FIG. 16, the same reference numerals as those in FIG. 8 denote the same parts.

In FIG. 16, a sensor core A comprises a pixel section 1, a column type noise canceling circuit (CDS) 2, a column type analog-to-digital converter (ADC) 3, a latch circuit 4, two line memories (MSTLS and MSTS) 5 and 6, and a horizontal shift register 7.

The pixel section 1 receives light via a lens 10, and generates charges corresponding to the incident light quantity by photoelectric conversion. In the pixel section 1, cells (pixels) 11 are two-dimensionally arrayed in rows and columns on a semiconductor substrate. One cell 11 has four transistors Ta, Tb, Tc, and Td and a photodiode PD. Each cell 11 receives pulse signals ADDRESSn, RESETn, and READn. Underneath the pixel section 1, load transistors TLM for a source follower circuit are arranged along the horizontal direction. One end of the current path of each load transistor TLM is connected to a corresponding vertical signal line VLIN, and its other end is grounded.

An analog signal corresponding to signal charges generated in the pixel section 1 is supplied to the ADC 3 via the CDS 2. The analog signal is converted into a digital signal by the ADC 3, and the digital signal is latched by the latch circuit 4. Digital signals latched by the latch circuit 4 are sequentially read out by the horizontal shift register 7 from the sensor core A via the line memories (MSTLS and MSTS) 5 and 6. Digital signals OUT0 to OUT5 read out from the line memories (MSTLS and MSTS) 5 and 6 are supplied to a wide dynamic range mixing (WDM) circuit 20. The WDM circuit 20 synthesizes two signals and outputs the synthesized signal outside the sensor via a subsequent wide dynamic range compressor (WDC) circuit 30.

A pulse selector circuit (selector) 12, signal reading vertical register (VR register) 13, storage time control vertical register (ES register for controlling a long storage time) 14, and storage time control vertical register (WD register for controlling a short storage time) 17 are arranged adjacent to the pixel section 1.

Reading from the pixel section 1 and control of the CDS 2 are executed in synchronism with pulse signals S1 to S4, READ, RESET/ADDRESS/READ, VRR, ESR, and WDR which are output from a timing generator (TG) 40. The pulse signals S1 to S4 are supplied to the CDS 2. The pulse signal READ is supplied to a pulse amplitude control circuit 70, and a signal VREAD output from the pulse amplitude control circuit 70 is supplied to the pulse selector circuit 12. The pulse signal RESET/ADDRESS/READ is also supplied to the pulse selector circuit 12. The pulse signal VRR is supplied to the VR register 13, the pulse signal ESR is supplied to the ES register 14, and the pulse signal WDR is supplied to the WD register 17. These registers select a vertical line in the pixel section 1, and the pulse signal RESET/ADDRESS/READ (typified by RESETn, ADDRESSn, and READn in FIG. 16) is supplied to the pixel section 1 via the pulse selector circuit 12. The pulse signal (address pulse) ADDRESSn is supplied to the gate of the row selection transistor Ta in the cell. The pulse signal (reset pulse) RESETn is supplied to the gate of the reset transistor Tc in the cell. The pulse signal (read pulse) READn is supplied to the gate of the read transistor Td in the cell. The pixel section 1 receives a bias voltage VVL from a bias generation circuit (bias 1) 15. The bias voltage VVL is applied to the gate of the load transistor TLM for the source follower circuit.

A VREF generation circuit 50 operates in response to a main clock signal MCK, and generates a reference waveform for A/D conversion (ADC). The amplitude of the reference waveform is controlled by data DATA input to a serial interface (serial I/F) 60. A command input to the serial interface (serial I/F) 60 is supplied to a command decoder 61, decoded by it, and supplied to the timing generator 40 together with the main clock signal MCK. The VREF generation circuit 50 generates triangular waves VREFTS and VREFTLS and supplies them to the ADC 3 in order to execute A/D conversion twice during one horizontal scan period. The pulse amplitude control circuit 70 receives the pulse signal READ output from the timing generator 40. By controlling the amplitude of the pulse signal READ, the pulse amplitude control circuit 70 generates the ternary pulse signal VREAD, and supplies it to the pulse selector circuit 12.

The WDM circuit 20 comprises subtracting circuits (−dark) 201 and 202 which subtract a dark signal of black level, a gain circuit (GA) 203 which amplifies an output from the subtracting circuit 202, a comparison A circuit 210, and a switch 204. The output side of the WDM circuit 20 is connected to the WDC circuit 30 having a white balance processing circuit (WB) 31 and compression circuit 32. The WDC circuit 30 simultaneously receives a signal STS which is stored in the line memory 6 and corresponds to a short exposure time (charge storage time), and a signal STLS obtained by adding signals STS and STL which are stored in the line memory 5 and correspond to short and long exposure times.

In an analog/digital conversion operation by the ADC 3, the black level (dark) is set to 64 LSB level. The subtracting circuits 201 and 202 subtract 64 black level from signals output from the line memories 5 and 6. The gain circuit (GA) 203 amplifies a signal SB obtained upon subtraction by the subtracting circuit 202, generating a signal SC. Letting TL and TS be the exposure times of the signals STL and STS, the gain amount can be calculated from the ratio TL/TS. By amplifying the signal SB by the gain, even a photoelectric conversion characteristic curve having a different gradient can be equivalently converted into a curve having the same gradient. The comparison circuit A 210 compares the signal SC with a signal SA obtained by subtracting the black level (dark) from the signal STLS. The switch 204 selects a larger signal. Hence, the signal SA and the signal SC amplified by the GAIN can be smoothly synthesized. The WDM circuit 20 increases the number of bits to output a 16-bit linearly converted/synthesized output signal SF at maximum. In the subsequent WDC circuit 30, the white balance (WB) processing circuit 31 equalizes the R, G, and B signal levels, and the compression circuit 32 compresses the signal to a 12-bit signal and outputs the compressed signal.

Figure 17:
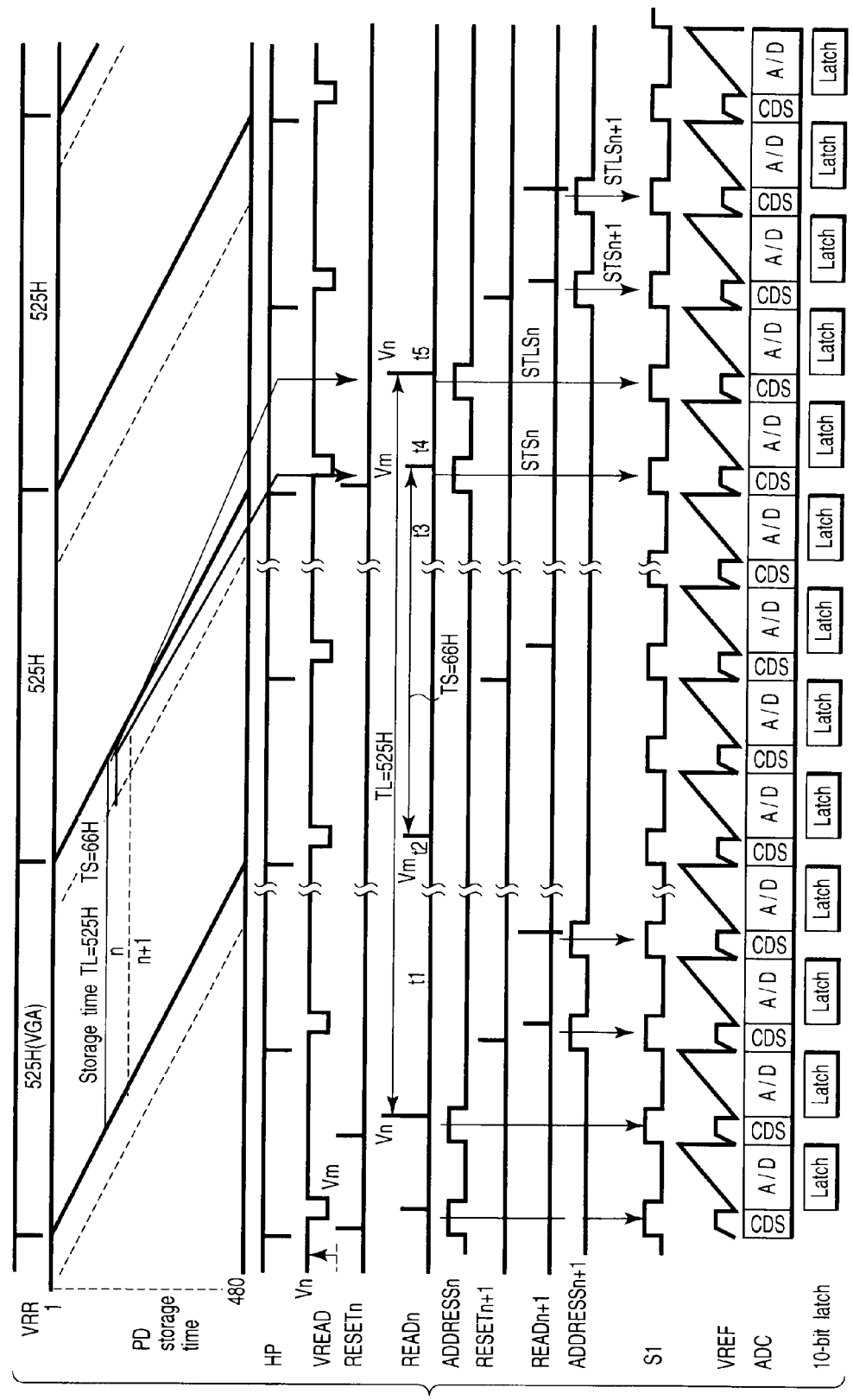
FIG. 17 is a waveform chart showing the operation timing of the CMOS image sensor according to the seventh embodiment of the present invention.

FIG. 17 is a waveform chart showing the operation timing of the CMOS image sensor shown in FIG. 16. In this example, the storage time during which charges obtained by photoelectrical conversion by the photodiodes PD on n vertical lines are stored is set to TL=525 H, and the short storage time is set to TS=66 H. The long storage time TL is controlled by setting the amplitude of the read pulse READ to high level (2.8V). The short storage time TS is controlled by setting the amplitude of the read pulse READ to low level=1V. In order to generate the read pulse READ, the pulse amplitude control circuit 70 controls the amplitude of the read pulse READ. The storage time TL can be controlled for each 1 H by the ES register 14. Although the storage time TS can be controlled for each 1 H by the WD register 17, it can also be controlled for each 1 H or shorter by changing the input pulse position of the selector circuit 12.

In the first read operation (t4) of signal charges stored in the photodiode PD, the pulse signals RESETn, READn, and ADDRESSn are supplied to the pixel section 1 in synchronism with a horizontal sync pulse HP to read out signal charges photoelectrically converted and stored in the photodiode PD. The amplitude of the read pulse READ at this time is set to a low-level voltage Vm. As signal charges read out first, some signal charges in the photodiode PD are read out by inputting the low-level read pulse READ at time t2 during the storage time of 525 H. At time t4, a signal stored again from time t2 to time t4 is read out from the photodiode PD.

At reset level after enabling and then disabling RESETn, reading is done by setting the amplitude of the reference waveform to an intermediate level. The intermediate level is automatically adjusted within the sensor so as to set the light-shielded pixels (OB) of the pixel section 1 to 64 LSB. Then, READn is enabled to output a signal. A triangular wave is generated as a reference waveform for the readout signal during the former 0.5 H period of the horizontal scan period, executing 10-bit A/D conversion. The A/D-converted signal (digital data) is latched by the latch circuit 4, and input to the line memory (MSTS) 6 after the end of A/D conversion.

In the second read operation (t5) from the photodiode PD, the pulse signals RESETn, READn, and ADDRESSn are input to the pixel section 1 after the first 0.5 H, reading out signal charges photoelectrically converted and stored in the photodiode PD. The amplitude of the read pulse READ at this time is set to a high-level voltage Vn.

Signal charges left in the photodiode PD are read out by inputting READn and ADDRESSn without applying the pulse RESETn. The RESET level is that of a signal at t4. By enabling READn, the readout signal is added to the signal STS stored in the detector FD, and the resultant signal is output. A triangular wave is generated as a reference waveform for the readout signal during the latter 0.5 H period of the horizontal scan period, executing 10-bit A/D conversion. The A/D-converted signal is latched by the latch circuit 4, and input to the line memory (MSTLS) 5 after the end of A/D conversion. In the next horizontal scan period, the signals are simultaneously output from the two line memories (MSTS and MSTLS) 6 and 5. The WDM circuit 20 linearly converts and synthesizes the signals of each pixel. As shown in FIG. 16, the wide dynamic range mixing (WDM) circuit 20 linearly converts and synthesizes the two signals to generate a 16-bit signal at maximum. In the subsequent WDC circuit 30, the white balance circuit 31 equalizes the R, G, and B signal levels in shooting a white object. Then, the compression circuit 32 compresses the highlight component of the 16-bit signal into a 12-bit signal, outputting the compressed signal from the sensor.

Figure 18:
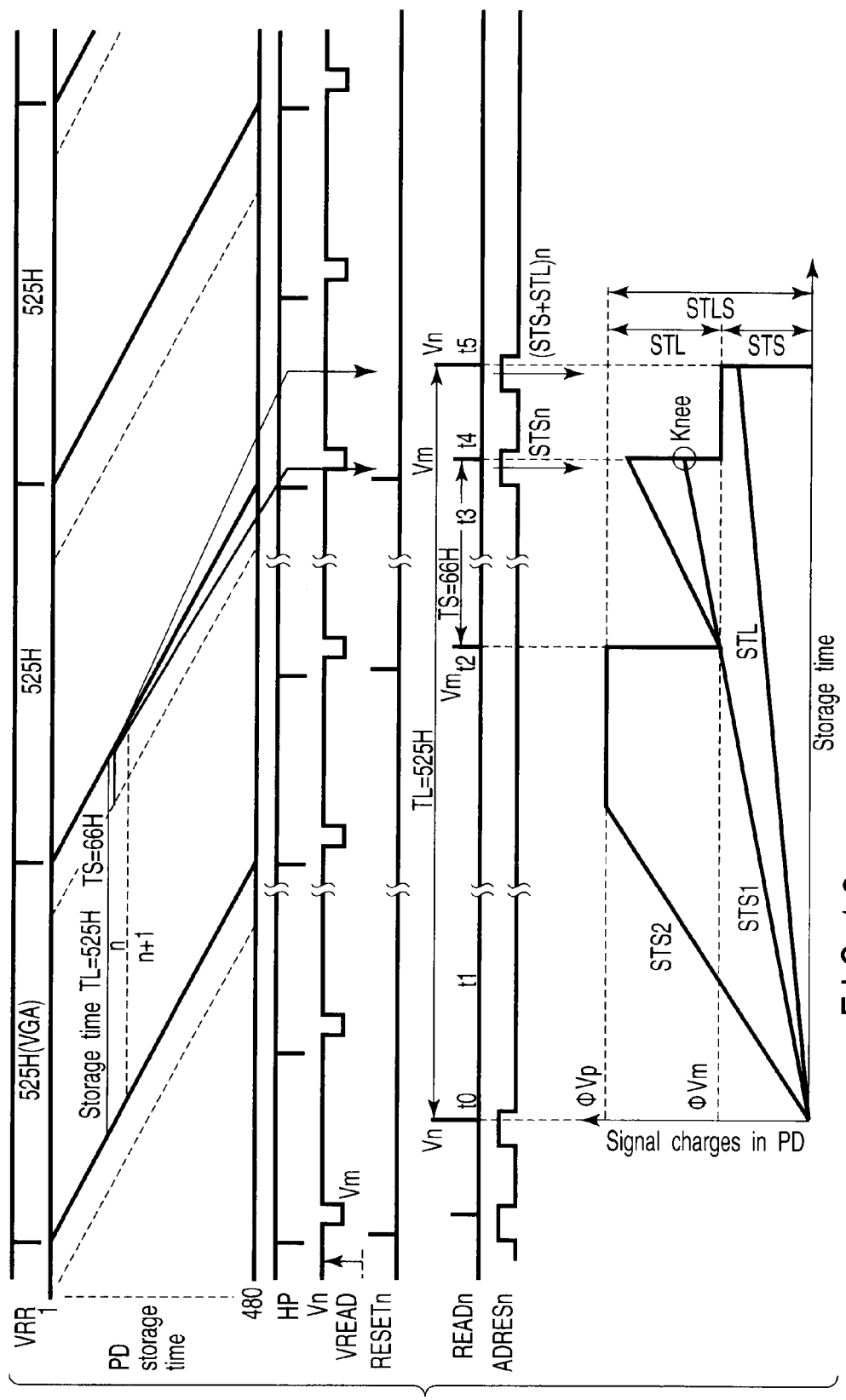
FIG. 18 is a timing chart for explaining storage of signal charges in a photodiode PD according to the seventh embodiment of the present invention.

FIG. 18 is a timing chart for explaining storage of signal charges in the photodiode PD in the operation of FIG. 17. At time to, all signal charges are read out from the photodiode PD by applying 2.8V as the pulse signal READ. At time t1, a signal photoelectrically converted by the photodiode PD is stored. At time t2, a signal of about ½ the saturation signal amount $\Phi$Vp is read out from the photodiode PD at the voltage Vm=1.0V of the pulse signal READ. A signal larger than a signal STS2 is sliced to $\Phi$Vm. No signal STL is output because the signal amount is small. At time t3, a signal is stored again in the photodiode PD. At time t4, signal charges larger than $\Phi$Vm are read out as the signal STS at the voltage=1.0V of the pulse signal READ. Accordingly, the signals STS1, STS2, and the like larger than $\Phi$Vm are output. At this time, no signal STL is read out because its level is sufficiently low. At time t5, signal charges equal to or smaller than $\Phi$Vm are read out as STL from the photodiode PD. The detector FD adds the signal STL and the signal STS read out at time t4, and outputs the added signal as the signal STLS. Since the signal STS1 or STL equal to or smaller than the knee point Knee is not read out from the photodiode PD at time t2, signal charges are kept stored at time t4. To the contrary, the signal STS2 read out from the photodiode PD at time t2 is sliced at the $\Phi$Vm level, and apparently its storage time stops. The gradient of the photoelectric conversion characteristic changes at the knee point Knee. That is, a signal prepared by giving the knee point Knee to the signal STS read out at time t4 is output.

According to the above-described arrangement, the signal STS corresponding to a short exposure time, and the signal STLS obtained by adding signals corresponding to long and short exposure times are separately A/D-converted and output during one horizontal scan period. Then, the two readout digital signals are added. This arrangement can widen the dynamic range without degrading the image quality.

Figures 19A, 19B:
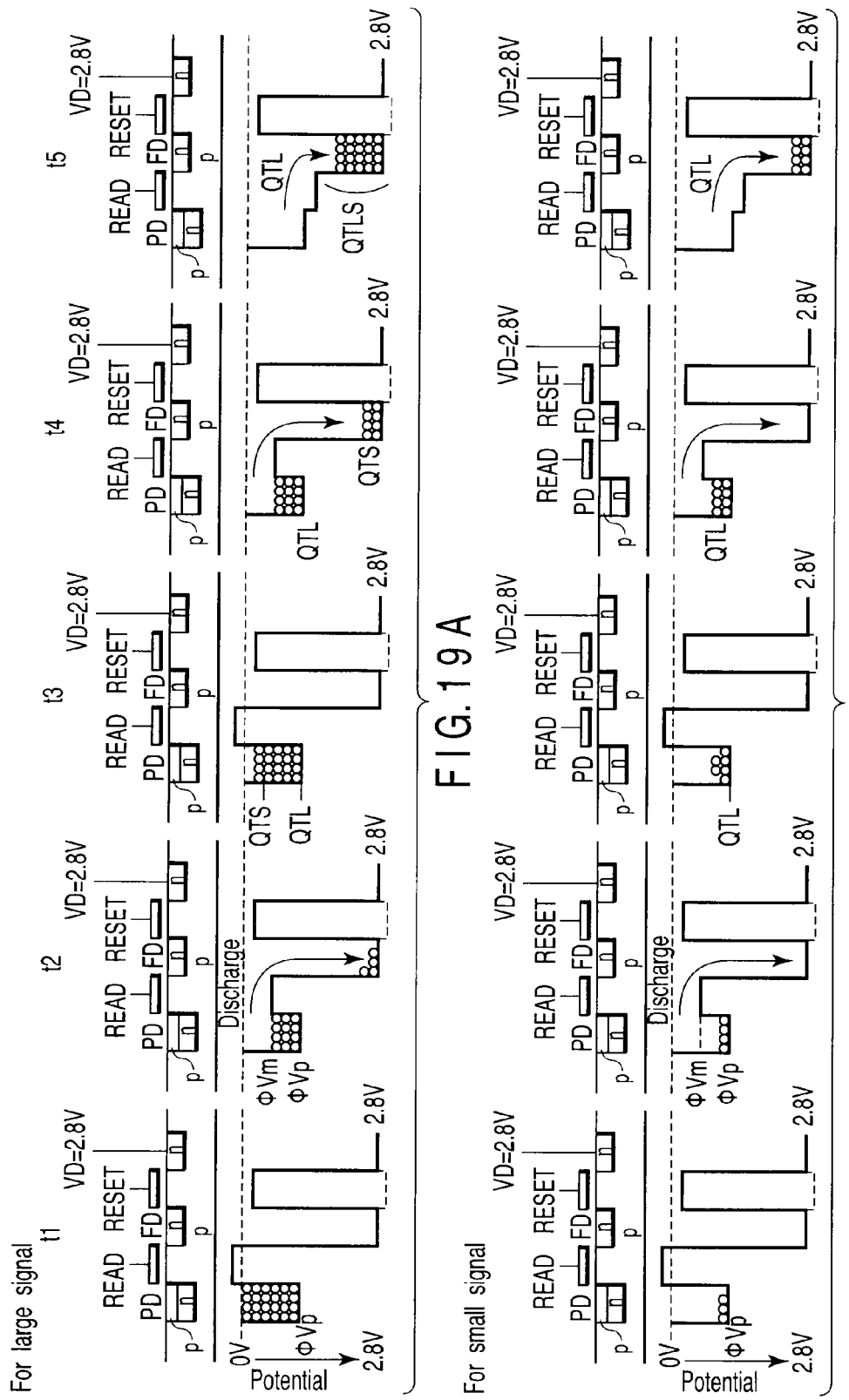
FIGS. 19A and 19B are views each showing the section and potential of a cell in a pixel section according to the seventh embodiment of the present invention.

FIGS. 19A and 19B are views each showing the section and potential of the pixel section 1 at times t1 to t5 in the operation timing chart shown in FIG. 18. FIG. 19A is a view showing a section and potential when storing a large signal, and FIG. 19B is a view showing a section and potential when storing a small signal.

The photodiode PD is formed by forming an n-type impurity diffusion region in a p-type semiconductor substrate. The surface of the n-type impurity diffusion region is shielded with a p-type impurity diffusion region. This structure provides a buried photodiode PD almost free from scratches and nonuniformities in a dark environment. The detector FD is formed in an n-type impurity diffusion region. Together with the n-type impurity diffusion region of the photodiode PD, the n-type impurity diffusion region of the detector FD functions as the source and drain regions of the read transistor (read gate) Td. A polysilicon gate electrode is formed on a gate insulating film (not shown) on the substrate between these n-type impurity diffusion regions. The gate electrode receives the read pulse READ. An n-type impurity diffusion region is formed adjacent to that of the detector FD. This n-type impurity diffusion region functions as the drain region of the reset transistor (reset gate) Tc, and that of the detector FD functions as its source region. A drain voltage VD (=2.8V, e.g., VDD) is applied to the drain region. A polysilicon gate electrode is formed on a gate insulating film (not shown) on the substrate between these n-type impurity diffusion regions. The gate electrode receives the reset pulse RESET. The reset transistor Tc can reset the detector FD to the drain voltage VD.

When storing a large signal, as shown in FIG. 19A, signal charges in the photodiode PD have already been saturated at time t1. At time t2, some signal charges saturated in the photodiode PD are output by applying a low-level read voltage (=1.0V) to the read gate. At time t3, a signal is stored again in the photodiode PD. At time t4, the signal stored again in the photodiode PD is read out to the detector FD by applying the low-level read voltage (=1.0V). At time t5, the remaining signal charges in the photodiode PD are read out to the detector FD by applying a high-level read voltage (=2.8V). The signal in the detector FD is added to signal charges QTS read out at time t4, outputting the added signal as QTLS. In other words, when the photodiode PD is saturated, a signal having a short storage time can be read out at time t4.

When storing a small signal, as shown in FIG. 19B, signal charges in the photodiode PD are not saturated at time t1. At time t2, the read gate is opened by the low-level read voltage (=1.0V). Since signal charges are not saturated in the photodiode PD, no charge is output from the photodiode PD. At time t3, signal charges are kept stored in the photodiode PD. At time t4, the low-level read voltage (=1.0V) is applied in order to read out signal charges from the photodiode PD. However, signal charges in the photodiode PD are small and are not read out to the detector FD. At time t5, all signal charges in the photodiode PD are read out to the detector FD by applying the high-level read voltage (=2.8V).

Figure 20:
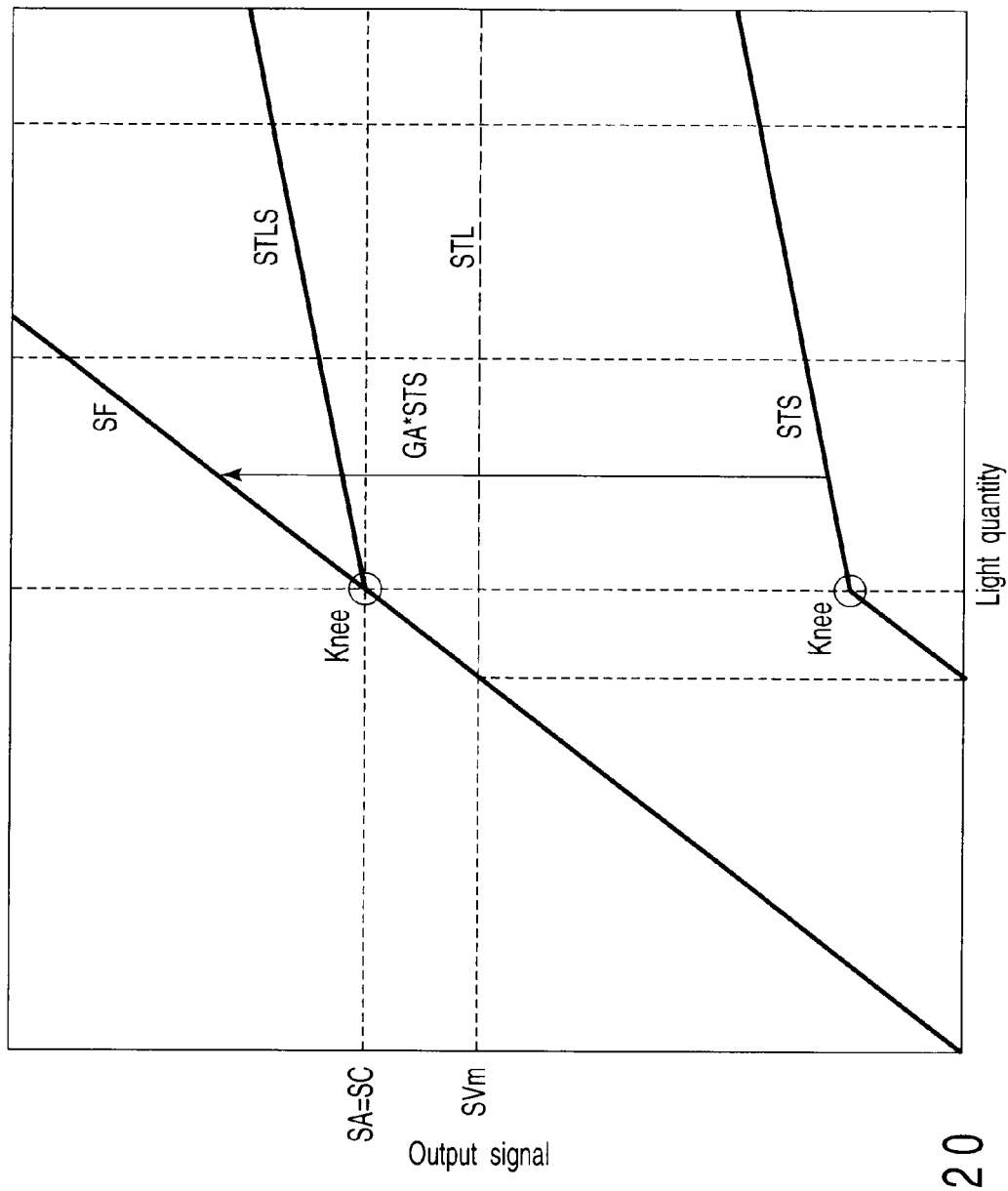
FIG. 20 is a graph showing a digital output signal representing the operation of a WDM circuit according to the seventh embodiment of the present invention.

FIG. 20 shows a digital output signal representing the operation of the WDM circuit 20. The abscissa axis represents the light quantity, and the ordinate axis represents the digital output level. The signal STLS increases with respect to the light quantity with a gradient which depends on the storage time TL. When the signal STLS increases to the point Knee, the gradient increases slowly in accordance with the storage time TS. Then, the signal STLS increases to the saturation signal of the photodiode PD. In contrast, output of the signal STS starts when the light quantity is larger than a storage capacitance limited by the read voltage Vm. The gradient corresponds to the storage time TL. When the light quantity exceeds the point Knee, the gradient increases slowly in correspondence with the storage time TS. The signal SF output from the WDM circuit 20 increases along the STLS signal line up to the point Knee of the light quantity. A signal larger than the point Knee is switched to one obtained by amplifying the signal STS by GA. The signal SF can be converted almost linearly by setting the GAIN of the amplifier circuit 203 to the storage time ratio TL/TS. In actual measurement, signals are not read out from the photodiode PD in the complete transfer mode, so an afterimage signal is added to the signal STS. Hence, the signal STS becomes slightly large. The linearity can be further improved by setting the GAIN to about 0.85 times of the amplification factor GA. At the point Knee, the signal SA equals the signal SB. The signal SA is prepared by subtracting the black level (dark) from the signal STLS. The signal SC is prepared by subtracting the black level (dark) from the signal STS and amplifying the resultant signal by the amplification factor GA. The black level (dark) is calculated from the average of light-shielded pixels (OB) arranged at the start of horizontal lines.

FIG. 21A is a block diagram showing the schematic arrangement of the WDC circuit 30, and FIGS. 21B, 21C, and 21D are graphs showing the operation. FIG. 21A is a block diagram showing the circuit arrangement. A 16-bit linearly converted signal SF is input to the WDC circuit 30. This signal has different G, R, and B signal levels when shooting a white object, as shown in FIG. 21B. In order to equalize the G, R, and B signal levels by the WB circuit 31, the R and B signals are amplified. Then, the G, R, and B signal levels of a signal SWB become equal to each other, as shown in FIG. 21C. The compression circuit 32 compresses the highlight signal component of the 16-bit signal to a 12-bit level at maximum. In compression mode 1, as shown in FIG. 21D, the signal is compressed along a curve similar to γ correction used in general signal processing. In compression mode 2, the signal is compressed along a polygonal line having two points in order to increase the grey level of the highlight signal component. For a 16-bit signal, the dynamic range can be widened by 64 times from that of a conventional 10-bit signal.

Figure 22:
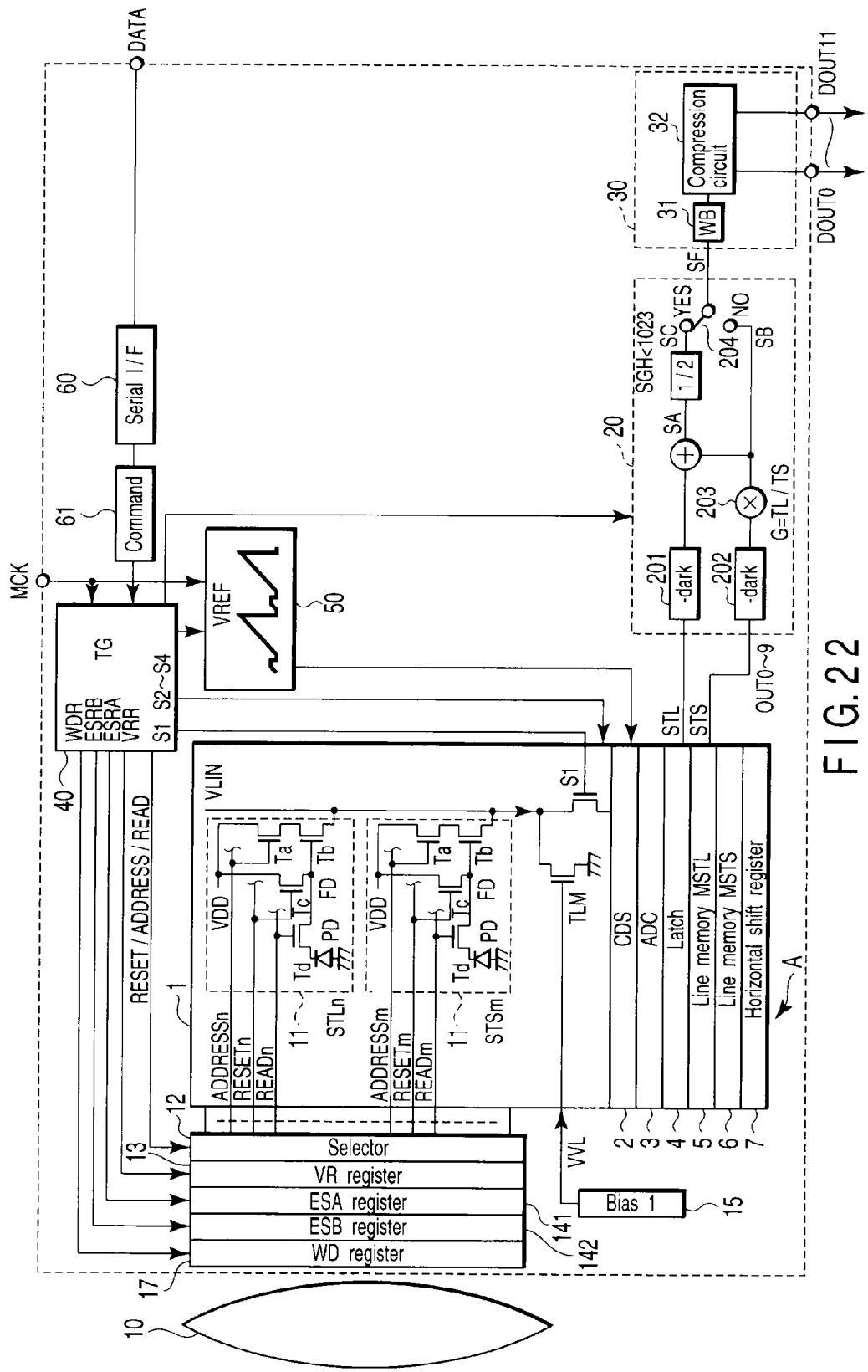
FIG. 22 is a block diagram showing the schematic arrangement of an amplifier type CMOS image sensor in order to explain a method of widening the dynamic range at high illuminance according to the eighth embodiment of the present invention.

FIG. 22 is a block diagram showing the schematic arrangement of an amplifier type CMOS image sensor in order to explain a method of widening the dynamic range at high illuminance according to the eighth embodiment of the present invention. In FIG. 22, the same reference numerals as those in FIG. 16 denote the same parts.

In FIG. 22, unlike FIG. 16, the dynamic range is widened using signals from two lines (rows) of a pixel section 1. Control registers (ESA and ESB) 141 and 142 are arranged to separately control the storage times of the two lines. The storage time of the first line is set to TL, and a signal is read out as STL. A photodiode PD on the second line outputs a signal STS having a short storage time. A WDM circuit 20 generates a signal SB by subtracting the black level (dark) from the signal STS, and amplifying the resultant signal by G at the storage time ratio TL/TS. The WDM circuit 20 generates a signal SA by subtracting the black level (dark) from a signal STL, and adding the resultant signal and the signal SB. The WDM circuit 20 generates a signal SC by halving the signal SA. A subsequent switching circuit 204 selects the signal SC when the signal STL is smaller than 1023 LSB, and the signal SB when the signal STL is equal to or larger than 1023 LSB. In this fashion, the WDM circuit 20 generates the signal SF by linearly converting signals from two lines having different storage times into one signal.

Figure 23:
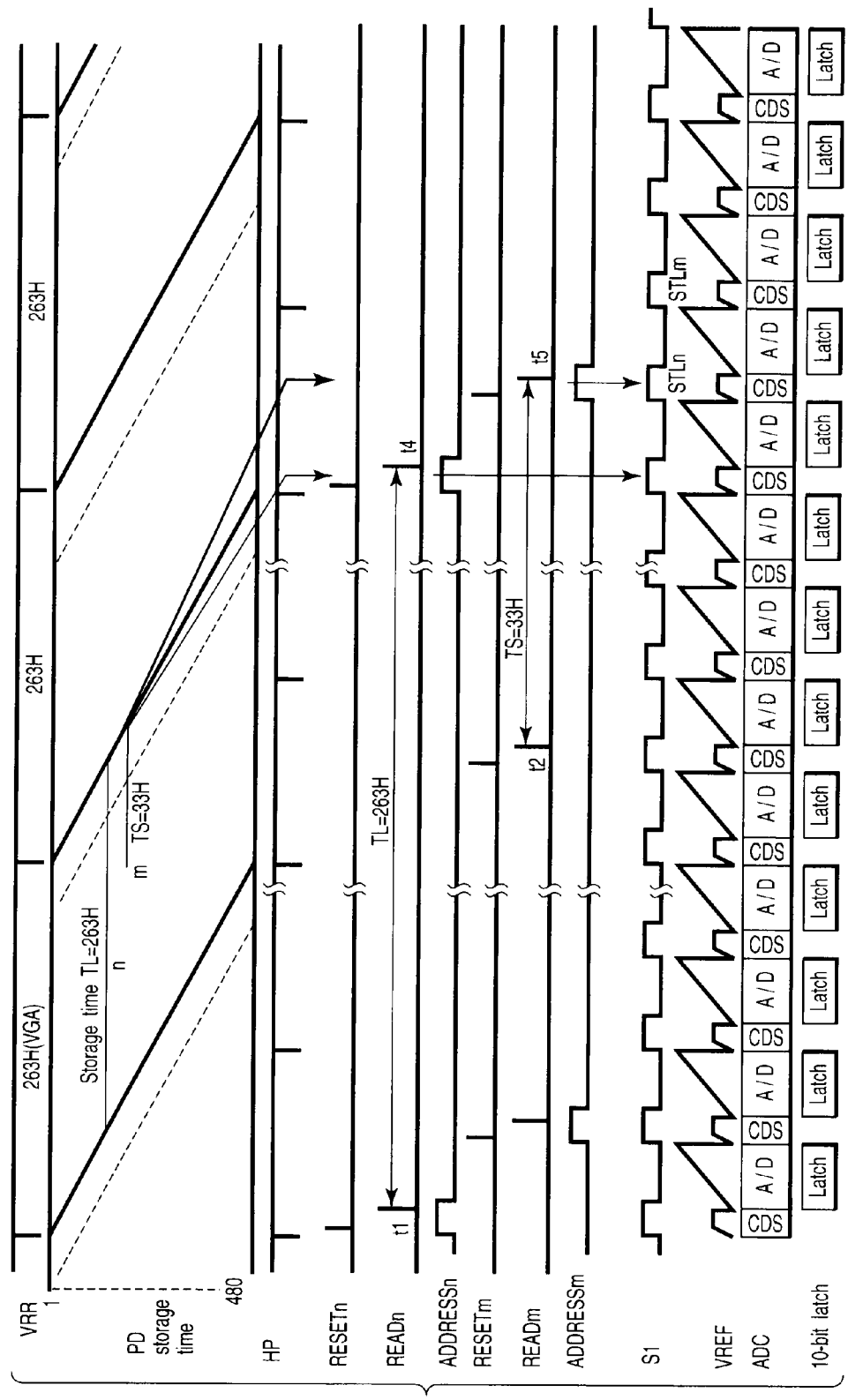
FIG. 23 is a waveform chart showing the operation timing of the CMOS image sensor according to the eighth embodiment of the present invention.

FIG. 23 is an operation timing chart. The number of vertical lines is halved to 263 H because signals from two lines are added and output in this operation. The storage time of the nth line is set to TL=263 H, and that of the mth line is set to TS=33 H. At time t4, signals stored in the nth line are output and A/D-converted into the signal STL. At time t5 after ½ H, signals stored during the storage time TS are read out and A/D-converted into the signal STS.

FIG. 24 is a block diagram showing the schematic arrangement of an amplifier type CMOS image sensor in order to explain a method of widening the dynamic range from low to high illuminances according to the ninth embodiment of the present invention. In FIG. 24, the same reference numerals as those in FIG. 16 denote the same parts.

In FIG. 24, unlike FIG. 16, VREF is generated three times during one horizontal scan period. The number of line memories in a sensor core A is also increased to three. A WDM circuit 20 receives three signals SGH, SGL, and STS from the sensor core A. The WDM circuit 20 is configured by combining those in FIGS. 16 and 1. A VREF generation circuit 50 generates VREFTS with a gradient GL during the first ⅓ H period. Then, the VREF generation circuit 50 generates VREFTL with the same gradient GL. Finally, the VREF generation circuit 50 generates VREFGH with a gradual gradient GH so as to apparently increase the analog GAIN. The dynamic range at high illuminance in the sixth embodiment is widened by VREFTS and VREFTL, and that at low illuminance in the first embodiment is widened by VREFTL and VREFGH. The WDM circuit 20 receives a signal having a short storage time as STS from the sensor core A. The signal SGL is prepared by adding signals having short and long storage times. The signal SGH is prepared by amplifying the signal SGL.

In an analog/digital conversion operation by an ADC 3, the black level (dark) is set to 64 LSB level. Subtracting circuits 211, 201, and 202 subtract the 64 black level from signals output from corresponding line memories 5, 6, and 8. A gain circuit (GA) 203 generates a signal SC1 by amplifying a signal SB obtained upon subtraction by the subtracting circuit 202. Letting TL and TS be the exposure times of the signals STL and STS, the gain amount GA can be calculated from the ratio TL/TS. A comparison circuit A 210 compares the signal SC1 with a signal SA obtained by subtracting the black level (dark) from the signal SGL by the subtracting circuit 201. A switching circuit 204 selects a larger signal. As a result, the signal SA and the signal SC1 amplified by the GAIN can be smoothly synthesized to generate a signal SC2. Then, the subtracting circuit 211 generates a signal SD1 by subtracting 64 LSB of black level (dark) from the signal SGH. A signal SC3 is generated by amplifying the signal SC2 by GC. The amplification factor GC can be calculated from the gradient GH/GL of the VREF amplitude. The signals SD1 and SC3 are added to generate a signal SD2. Since the signal level is doubled as a result of addition, the signal SD2 is halved at the subsequent stage to generate a signal SE. This process can reduce noise by 3 dB. A switch 212 is switched (by a determination circuit: not shown) to select, as a signal SF, the signal SE when the signal SGH is smaller than 1023 LSB level, and the signal SC3 when the signal SGH is equal to or larger than 1023 LSB level. Hence, the signal SE and the signal SC3 amplified by the GAIN can be smoothly synthesized, obtaining, as the signal SF, a signal which changes linearly from low illuminance to high illuminance with respect to an optical input signal. The WDM circuit 20 increases the number of bits to output a 16-bit signal at maximum. A white balance (WB) processing circuit 31 equalizes the R, G, and B signal levels so that a compression circuit 32 can compress the signal to a 12-bit signal and output it.

Figure 25:
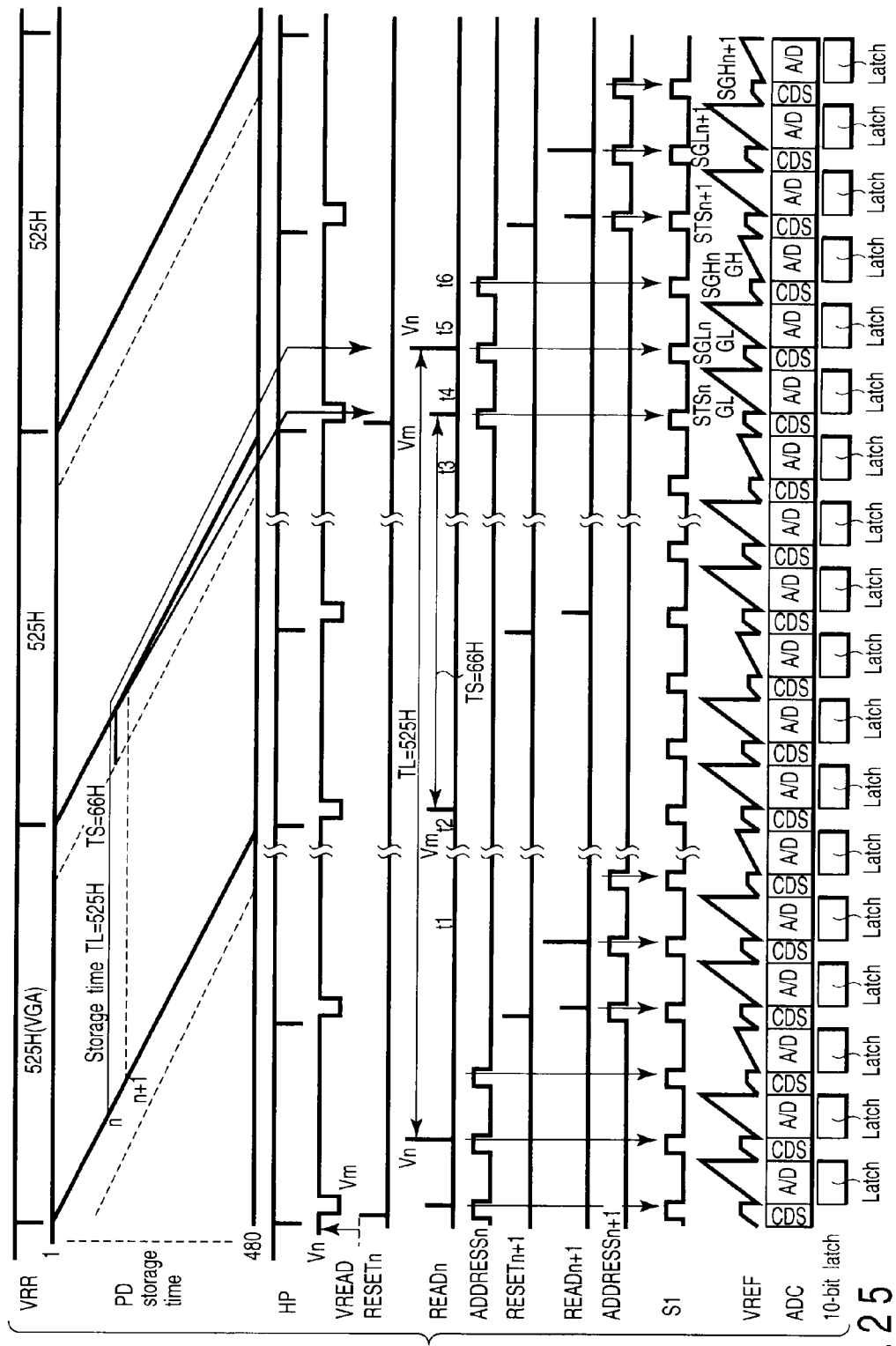
FIG. 25 is a waveform chart showing the operation timing of the CMOS image sensor according to the ninth embodiment of the present invention.

FIG. 25 is an operation timing chart. At time t4, the signal STS stored during the high-luminance storage time TS is output. At time t5, no pulse RESETn is output, and a signal corresponding to the sum of the storage times TL and TS is output as SGL. The VREF amplitude at this time is set to the large gradient GL. At time t6, a signal stored in a detector FD is read out again. The VREF amplitude is set to the gradient GH to increase the analog GAIN and set a fine resolution for a low-level signal. The operation in FIG. 3 may also be applied to this reading.

The 10th embodiment will be described as a modification to the ninth embodiment.

Figure 26:
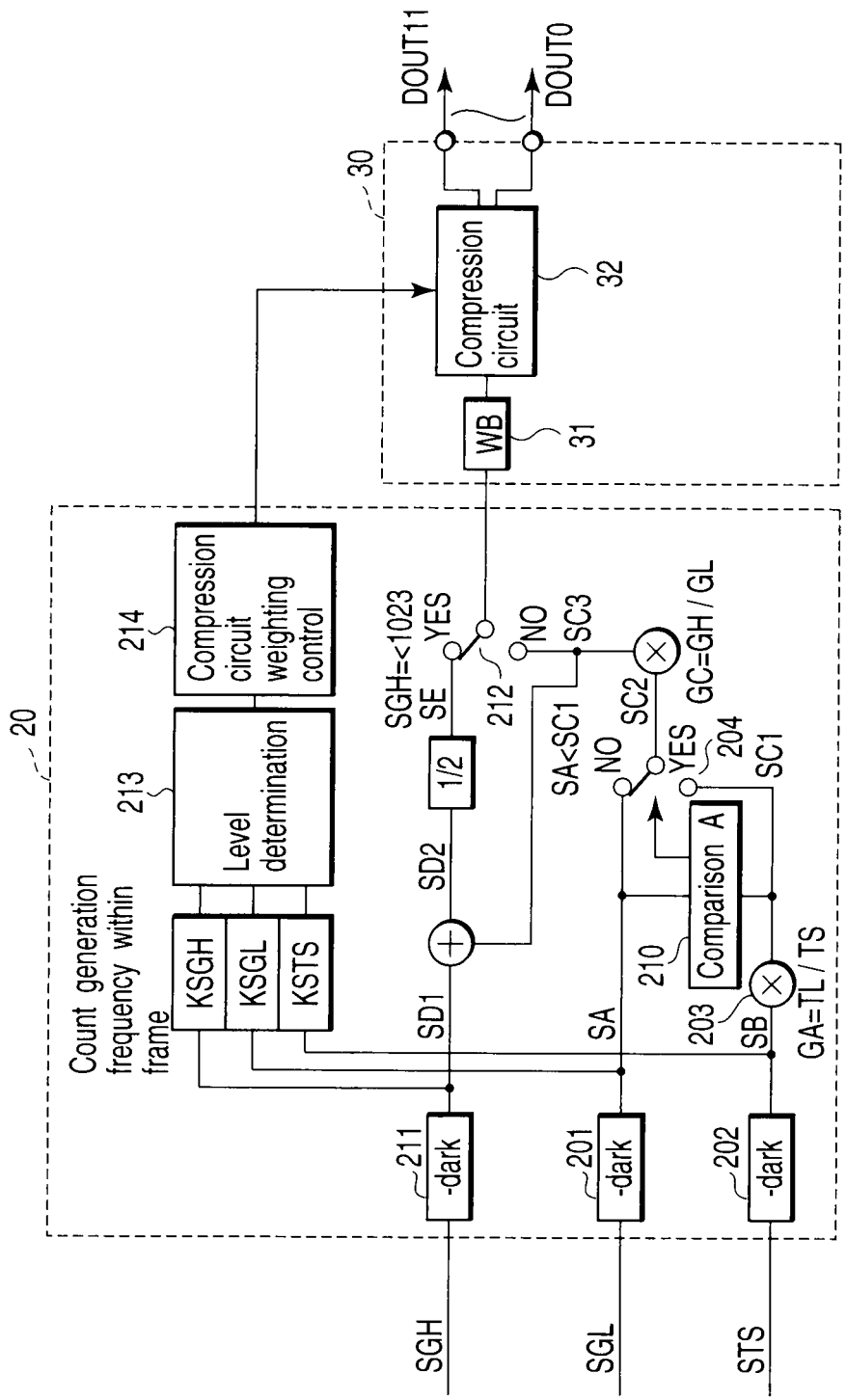
FIG. 26 is a diagram showing a modification of a WDM circuit according to the 10th embodiment of the present invention.

FIG. 26 shows a modification of the WDM circuit. Generation frequencies KSGH, KSGL, and KSTS of three signals are integrated within a frame, and a signal level exhibiting the highest generation frequency is extracted. A level determination circuit 213 determines the levels of these signals, and reflects the determination result in the next frame. Then, a compression circuit 214 weights the signal.

Figure 27A:
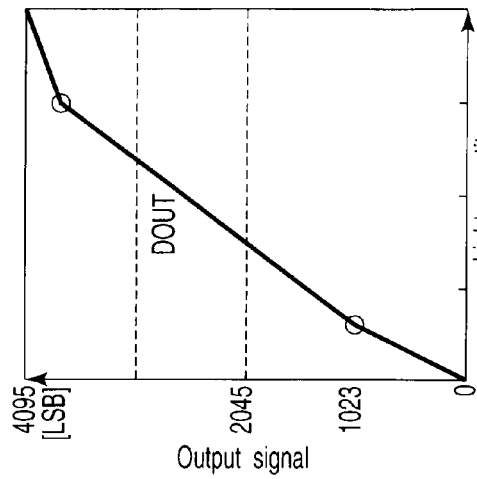
FIGS. 27A to 27D are graphs showing a control method according to the 10th embodiment of the present invention.
Figure 27B:
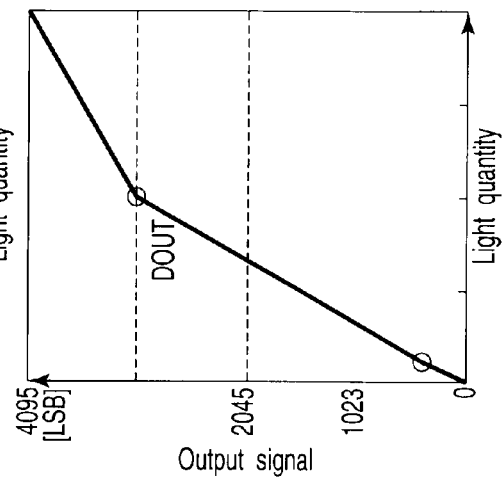
Figure 27C:
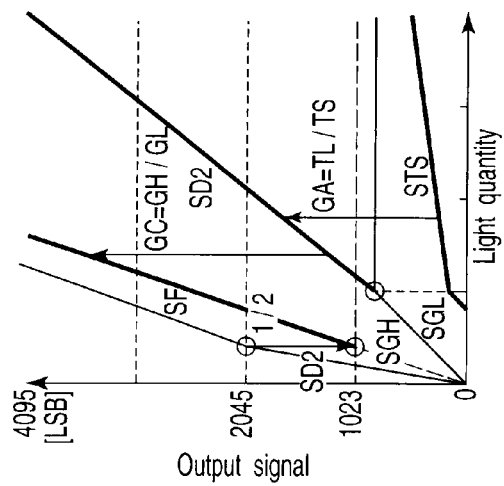
Figure 27D:
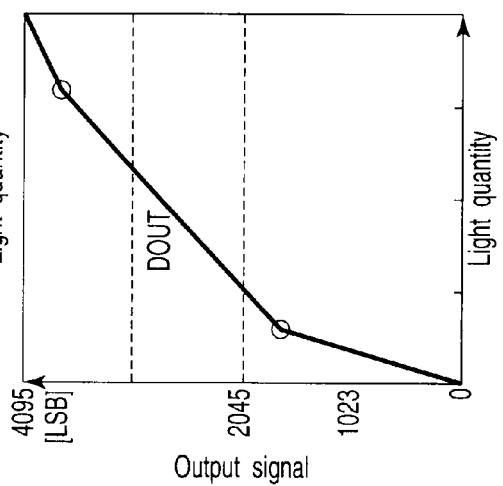

FIGS. 27A, 27B, 27C, and 27D show the control method. For descriptive convenience, the dark level is set to 0 LSB. FIG. 27A shows three signals and their synthesis method. A signal SC2 is generated by linearly converting and synthesizing signals SGL and STS. A signal SC3 is generate by amplifying the signal SC2 by GC by an amplifier circuit, and a signal SD2 is generated by adding the signal SC3 and a signal SD1. This signal has a double signal level because it is obtained by SGL and SGH. This signal is halved and used as a low-level signal SF. As a high-level signal, the signal is switched to one obtained by amplifying the signal SC2 by GC. Three signals are linearly synthesized, finally generating a linear signal SF. FIG. 27B shows a signal DOUT output from a WDM circuit 20. FIG. 27B shows a state in which all the three signals are equally reproduced. Since a low-illuminance signal has a high resolution, the GAIN is increased to make the low-illuminance signal clear. In FIG. 27C, the GAIN of a low-illuminance signal is increased to emphasize the low-illuminance signal. In FIG. 27D, the reproduction level of a high-luminance signal is raised to emphasize the high-luminance signal so as to make the high-luminance image clear.

Figure 28:
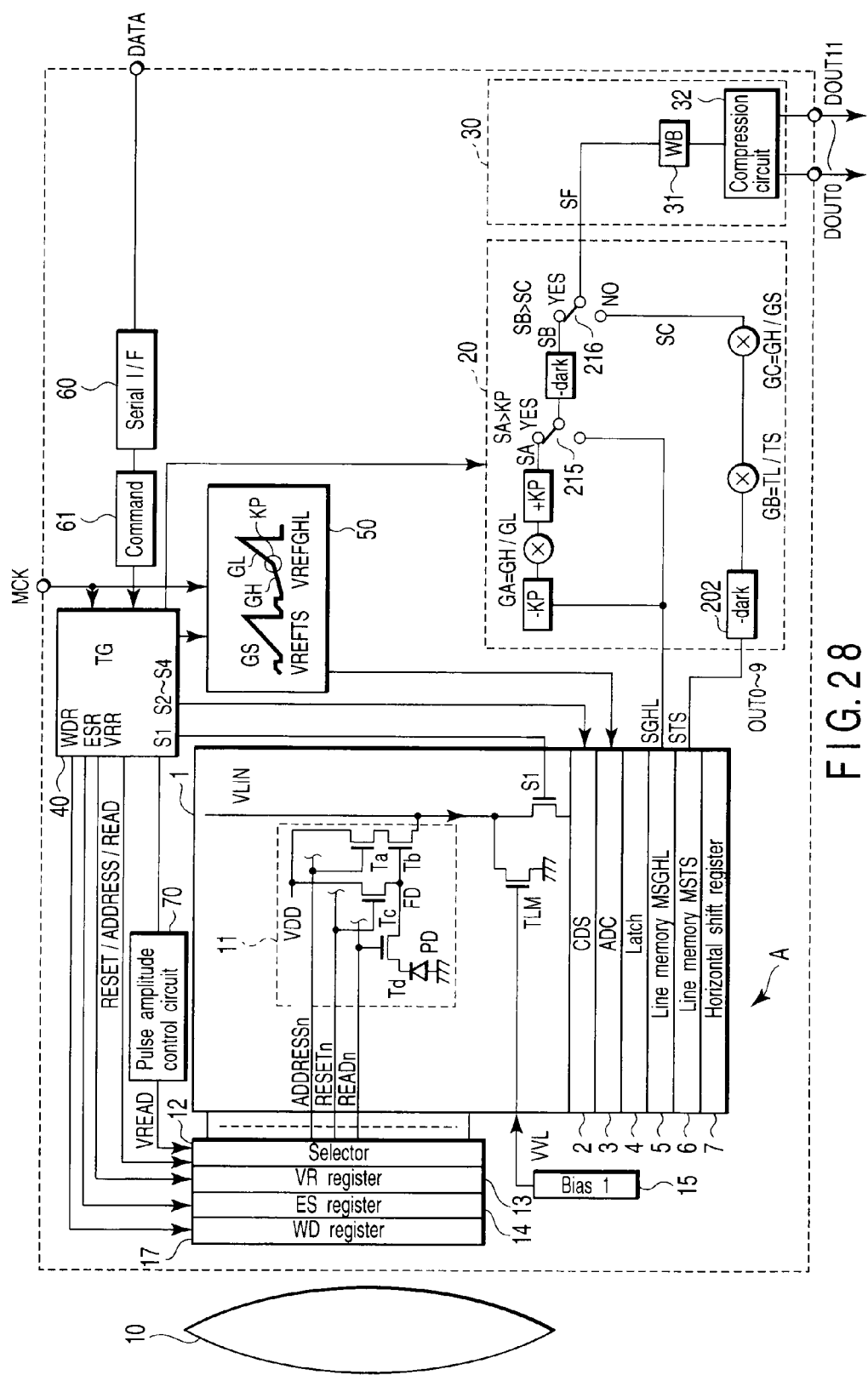
FIG. 28 is a block diagram showing the schematic arrangement of an amplifier type CMOS image sensor in order to explain a method of widening the dynamic range from low to high illuminances according to the 11th embodiment of the present invention.

FIG. 28 shows the 11th embodiment which widens the dynamic range from low to high illuminances. In FIG. 28, the same reference numerals as those in FIG. 24 denote the same parts.

In FIG. 28, unlike FIG. 24, VREF is generated twice, and the latter VREFGHL is generated along a polygonal line having two gradients. The first rise gradient is set to GH, and the gradient changes to GL midway along VREFGHL. This signal is read out from a line memory (MSGHL) 5, and input as a signal SGHL to a WDM circuit 20. A signal larger than the point KP of VREFGHL is amplified by GA by an amplifier circuit. This amplification factor is calculated from the VREF gradient ratio GH/GL. By switching a signal larger than the KP level as a signal SA, a signal SB is generated by linearizing the signal SGHL. A signal SC is prepared by subtracting the black level (dark) from a signal STS by a subtracting circuit 202, amplifying the signal by GB at the storage time ratio TL/TS, and amplifying the signal by GC at the ratio GH/GS. The signals SB and SC are compared, and a switching circuit 216 switches to a larger signal, generating a linearly converted/synthesized signal SF.

Figure 29:
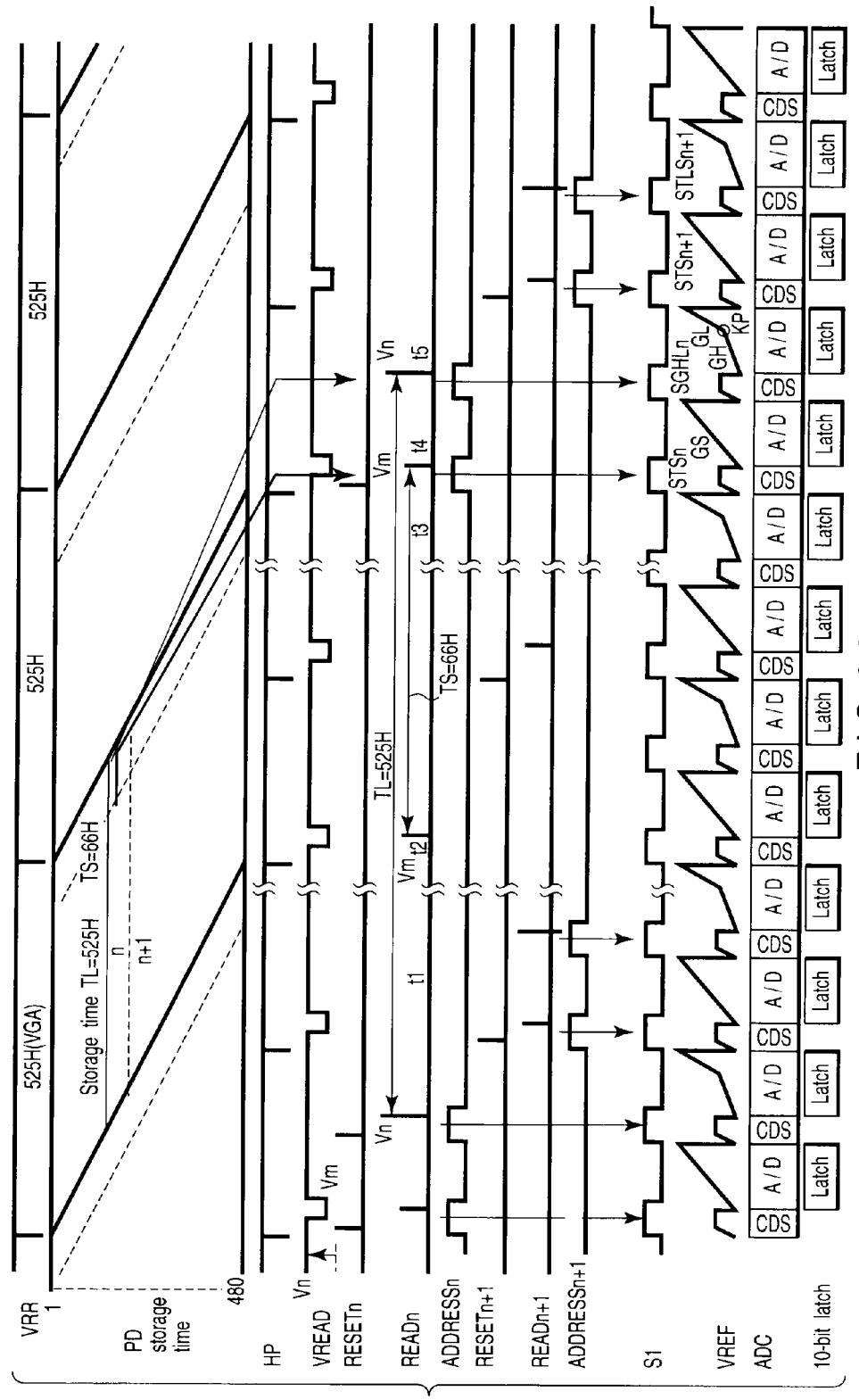
FIG. 29 is a waveform chart showing the operation timing of the CMOS image sensor according to the 11th embodiment of the present invention.

FIG. 29 is an operation timing chart. At time t4, the signal STS stored during the high-luminance storage time TS is output. At time t5, a signal corresponding to the sum of the storage times TL and TS is output as SGHL. At this time, VREF rises with the gradient GH, and its gradient changes to GL at the point KP. That is, the resolution of a low signal level is increased.

Figure 30:
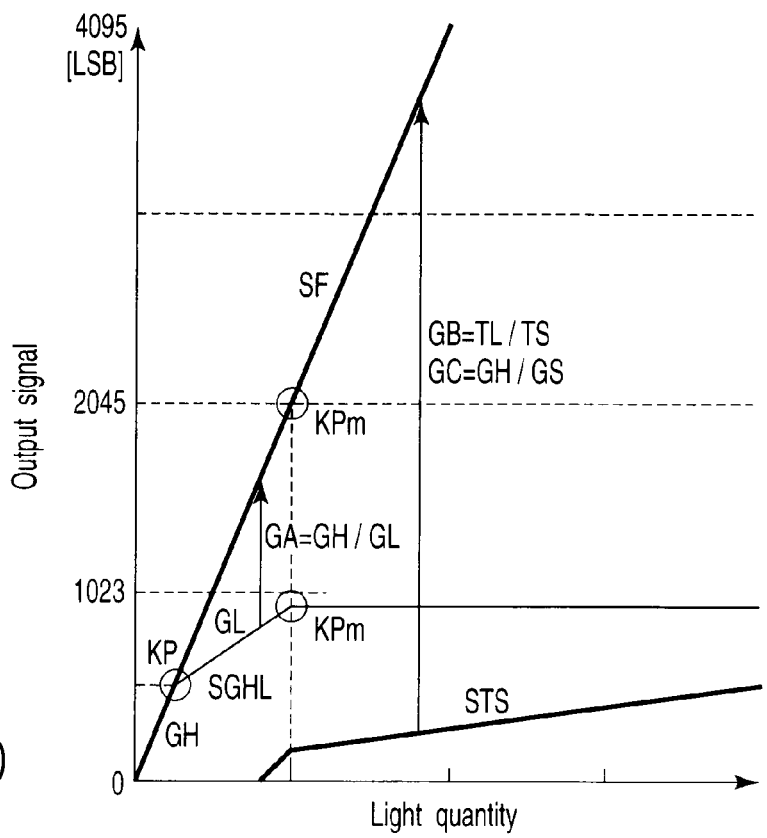
FIG. 30 is a graph showing a control method according to the 11th embodiment of the present invention.

FIG. 30 shows the control method. The signal SGHL is first output with a gradient corresponding to the gradient GH, and its gradient changes gradually from the KP level. At a point KPm determined by a read voltage Vm and the storage time ratio, the signal SGHL changes to a signal having a gradient STS determined by the storage time TS. A signal equal to or larger than the KP level of the signal SGHL is amplified at the amplification factor GA=GH/GL. A signal larger than KPm is switched to one obtained by amplifying STS by GB and GC, thereby linearizing the final signal SF.

Figure 31:
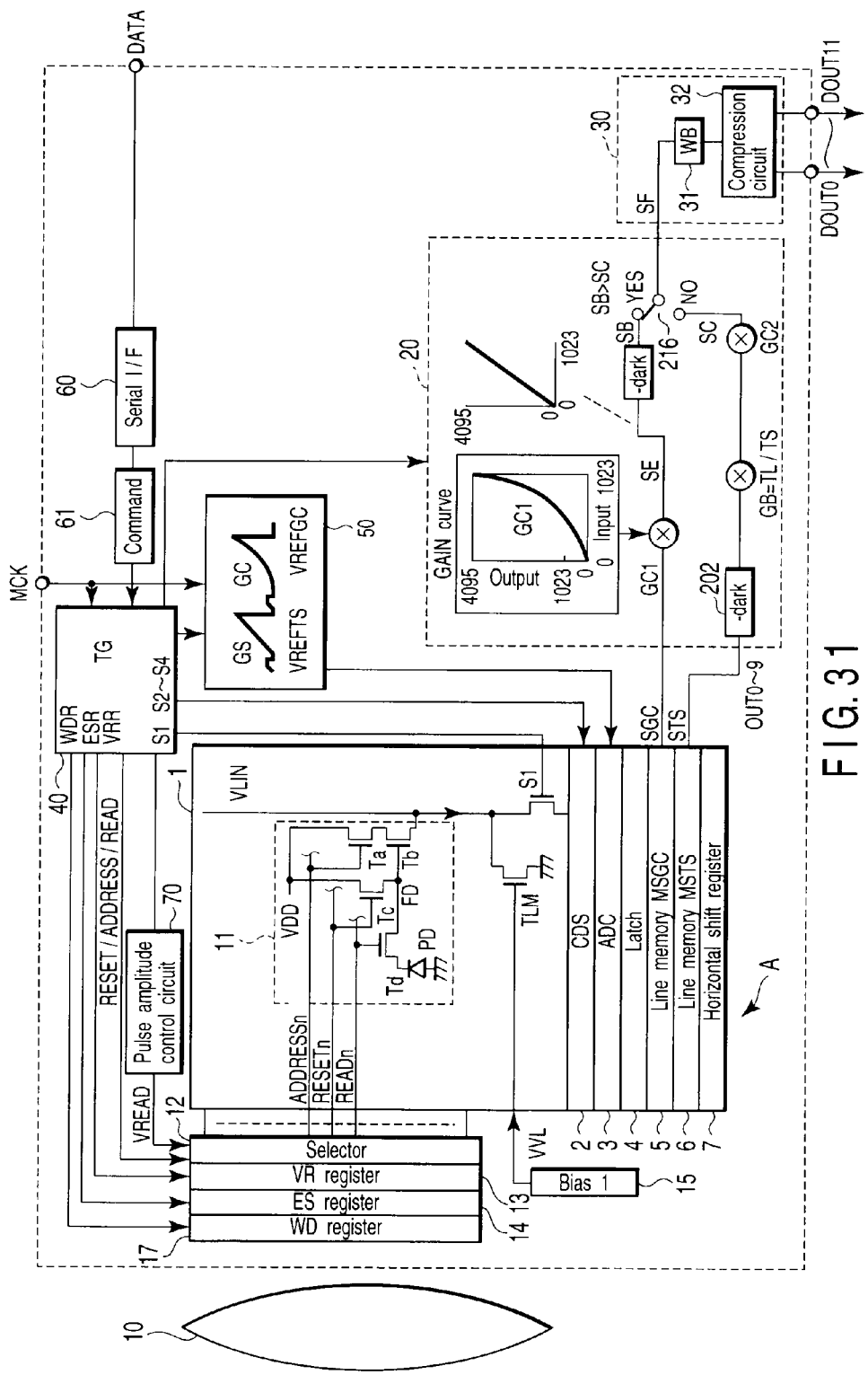
FIG. 31 is a block diagram showing the schematic arrangement of an amplifier type CMOS image sensor in order to explain a method of widening the dynamic range from low to high illuminances according to the 12th embodiment of the present invention.

FIG. 31 shows the 12th embodiment which widens the dynamic range from low to high illuminances. In FIG. 31, the same reference numerals as those in FIG. 28 denote the same parts.

In FIG. 31, unlike FIG. 28, VREF is generated twice, and the latter VREFGC is generated with a curve gradient GC which changes smoothly. This gradient increases gradually in accordance with the counter value. Apparently, the GAIN is large for a small input signal and small for a large signal. In a WDM circuit 20, the GAIN curve of an amplifier circuit GC1 is set to GC1 in FIG. 34 with respect to an input signal SGC in correspondence with the curve GC of a VREF generation circuit 50. That is, as the input signal SGC increases, the GAIN increases. The amplifier circuit GC1 outputs a linear signal SE with respect to the input signal. The signal is linearly converted into a 12-bit output which is four times larger than a conventional 10-bit output. In other words, the dynamic range is widened to four times the conventional one. The gradient GC can be freely set. In general, an input signal is converted by squaring it, multiplying it by a coefficient such as the reciprocal of the power, or creating a table. A signal SB is generated by subtracting the black level (dark) from the signal SE. A signal SC is generated by subtracting the black level (dark) from a signal STS, amplifying the signal by GB at the storage time ratio TL/TS, and amplifying the signal by a maximum GAIN coefficient GC2 corresponding to the curve GC of VREF. The signals SB and SC are compared, and a switching circuit 216 switches to a larger signal, generating a linearly converted/synthesized signal SF.

Figure 32:
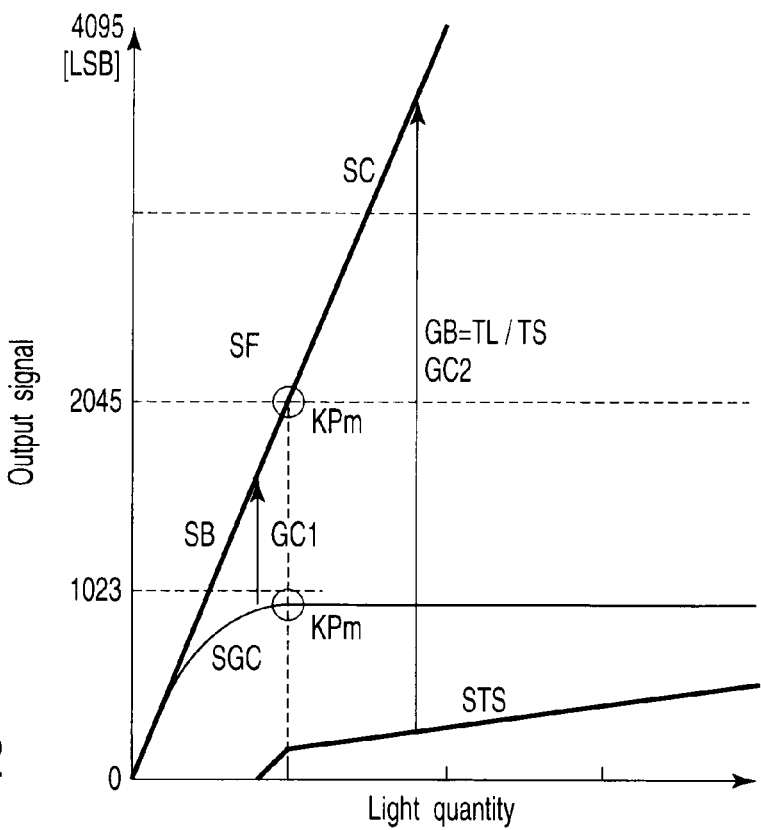
FIG. 32 is a graph showing a control method according to the 12th embodiment of the present invention.

FIG. 32 shows the control method. The gradient of the signal SGC is large at first, and decreases as the light quantity increases. The signal SGC increases up to a point KPm determined by the read voltage Vm and the storage time ratio. After this point, the storage time of the signal STS becomes short, so the signal STS increases with a gradual gradient. In linear conversion/synthesis, the signal SGC is amplified along the GAIN curve GC1. Then, a linearly converted signal SE is generated. A signal larger than KPm is switched to one obtained by amplifying STS by GB and GC2, thereby linearizing the final signal SF.

FIG. 33 shows the 13th embodiment of the present invention. In FIG. 33, the same reference numerals as those in FIG. 11 denote the same parts.

In FIG. 33, unlike FIG. 11, signals are added using signals from two lines (rows) of a pixel section 1. The storage time is equal between the two lines. A WDM circuit 20 generates a signal SA by subtracting the black level (dark) from a signal STA, and a signal SB by subtracting it from a signal STB. The WDM circuit 20 generates a signal SF by adding the signals SA and SB. This operation provides a signal which is the sum of signals from two vertical lines. This is applicable to a monitoring mode in which the number of vertical lines is substantially halved. The signal is substantially doubled to increase the sensitivity. Even noise can be reduced by 3 dB.

Figure 34:
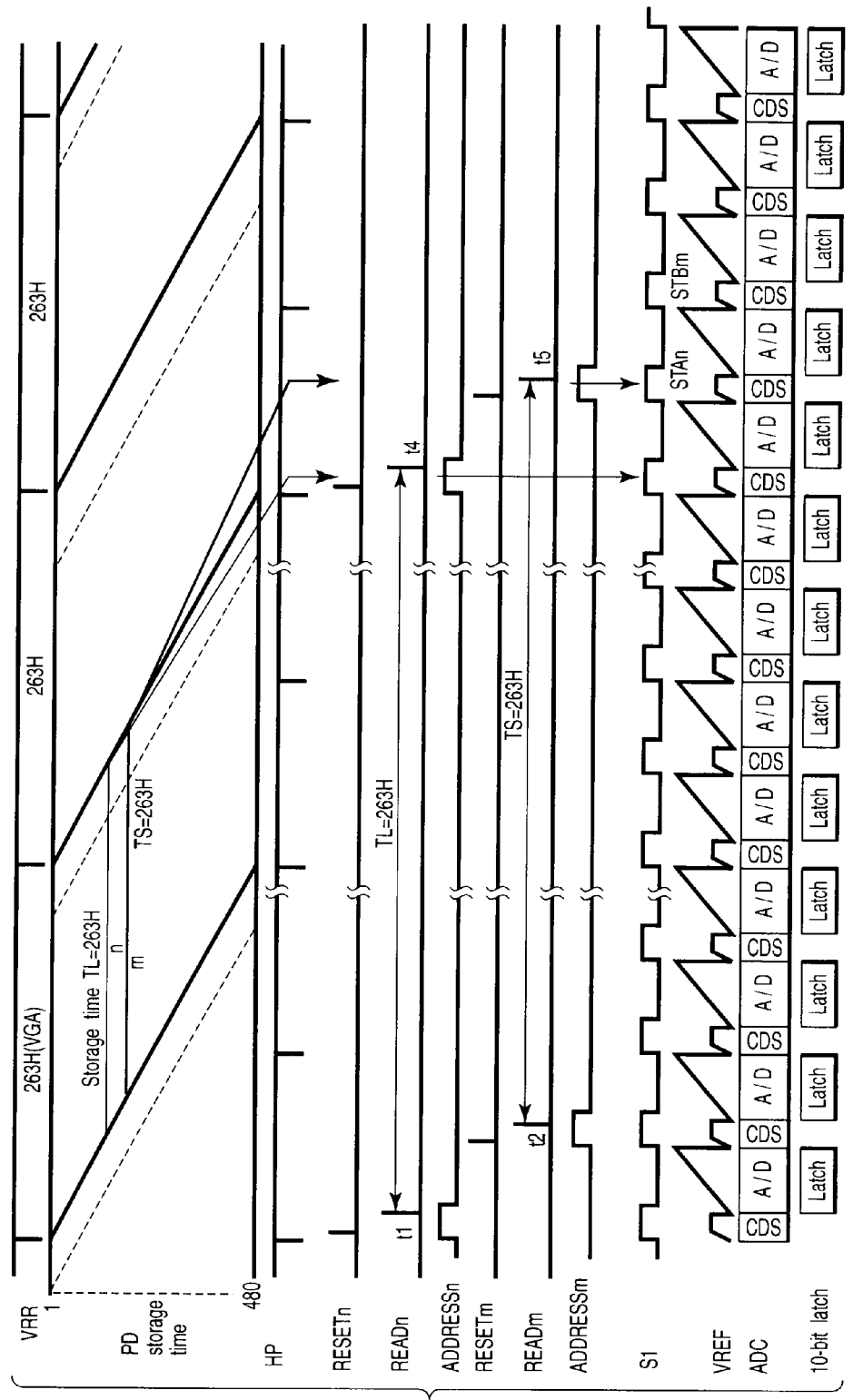
FIG. 34 is a waveform chart showing the operation timing of the CMOS image sensor according to the 13th embodiment of the present invention.

FIG. 34 is an operation timing chart. The number of vertical lines is halved to 263 H because signals from two lines are added and output in this operation. The storage time of n lines is set to TL=263 H, and that of m lines is also set to TS=263 H. At time t4, signals stored in n lines are output and A/D-converted into the signal STA. At time t5 after ½ H, a signal stored during the storage time TS is read out and A/D-converted into the signal STB. Since a color sensor generally has a color filter of the Bayer array, signals are added while skipping one line in the same color.

Figures 35A, 35B, 35C, 35D:
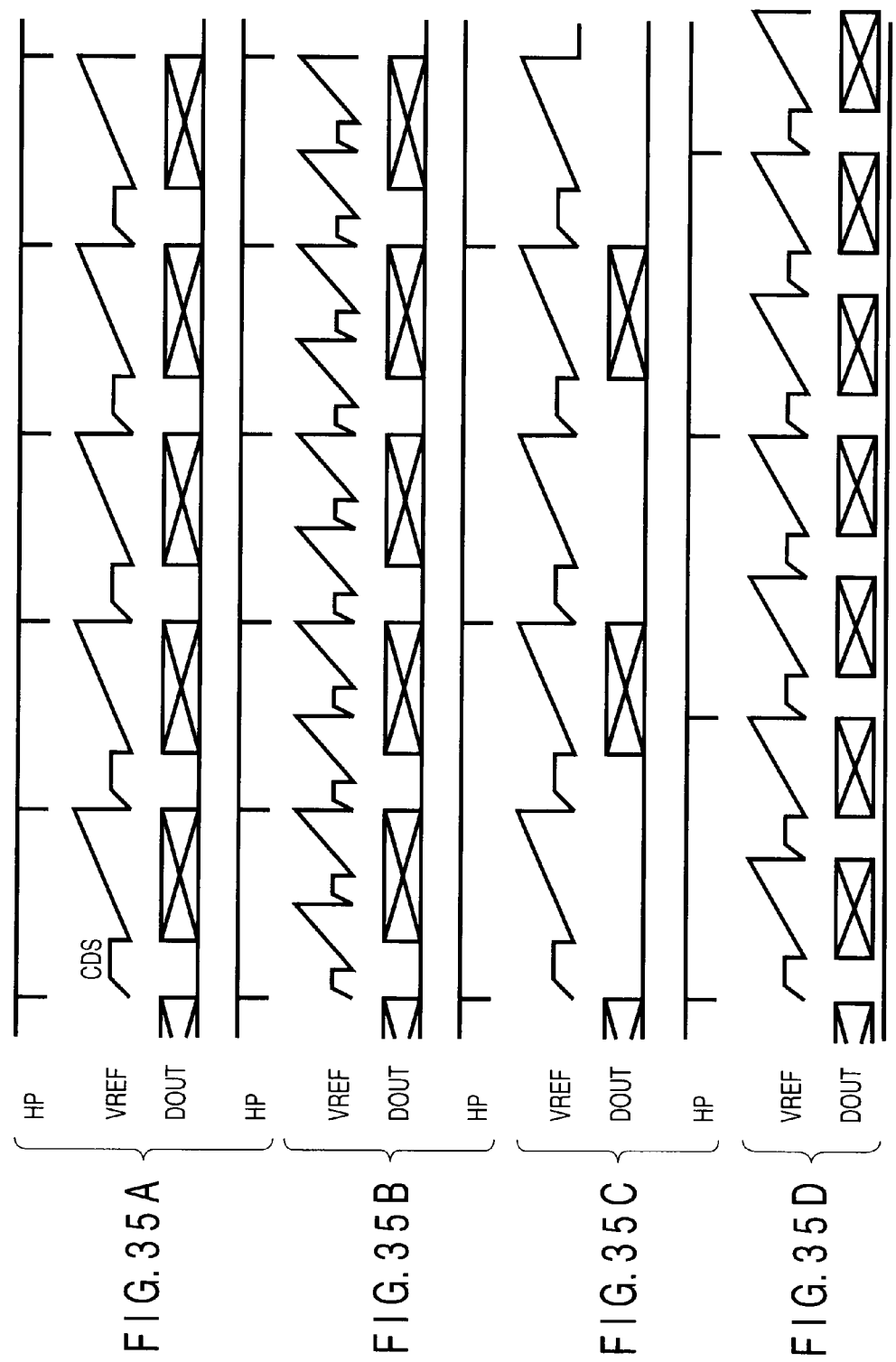
FIGS. 35A to 35D are waveform charts showing modifications of the operation timing of a CMOS image sensor according to the 14th embodiment of the present invention.

FIGS. 35A, 35B, 35C, and 35D show modifications of the operation timing. FIG. 35A represents a normal operation. In this operation, no sensor output signal DOUT is output from a pixel during the signal read period so that no noise of the digital output DOUT is mixed in the CDS operation. FIG. 35B shows an operation according to the embodiment of the present invention. In FIG. 35B, the CDS operation is executed even during the CDS operation period of the second half. To prevent the mixture of noise, the horizontal scan period is substantially doubled to prevent the digital output DOUT during the latter CDS operation period, as shown in FIG. 35C. Since the frame frequency is doubled to slow down the operation, the digital output DOUT is divided into two in the first and second halves of the horizontal scan period in FIG. 35D. The latter CDS operation period is set between the first and second halves of the horizontal scan period. By generating a digital output as an LVDS output or serial output, digital noise is reduced. Thus, even if the CDS operation is executed in FIG. 35B, the mixture of noise can be reduced. It is also possible to decrease the number of A/D conversion bits of VREF from 10 bits to 9 bits, shorten the horizontal scan period, and increase the frame operation frequency.

As described above, according to the embodiments of the present invention, a column ADC type CMOS image sensor executes A/D conversion, outputting signals having different gradients with respect to an optical input signal. A linear conversion circuit converts the output signals having different gradients as a result of A/D conversion into one linear signal by executing GAIN adjustment so as to change the gradients into the same one. The embodiments of the present invention can, therefore, provide a high-quality CMOS sensor which widens the dynamic range and increases the S/N ratio.

More specifically, signals having different gradients with respect to an optical input signal amount are output, and the different gradients are linearly converted into the same one by a signal processing circuit. The dynamic range can be widened to cope with dark and bright scenes in correspondence with the object illuminance. Since a signal is linearized, color reproduction of a bright object can be improved. This method can execute a stable dynamic range widening operation which is hardly influenced by the power supply voltage and sensor operation temperature.

The embodiments can provide a solid-state image sensing device which can widen the dynamic range and improve the image quality.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image sensing device comprising:
a pixel section having photodiodes two-dimensionally arrayed on a semiconductor substrate, a reading circuit which reads out signal charges from the photodiodes to detectors, an output circuit which outputs charges from the detectors, and a reset which resets the detectors,
an exposure time control circuit which controls an exposure time during which the photodiode performs photoelectric conversion,
a column amplifying circuit which amplifies a signal output from the output circuit,
an A/D conversion circuit which A/D-converts a signal amplified by the column amplifying circuit,
a plurality of line memories which store signals converted by the A/D conversion circuit, and
a signal processing circuit which processes a plurality of output signals from the plurality of line memories,
wherein a signal stored in the photodiode is read out by the reading circuit divisionally by a plurality of number of times, the column amplifying circuit changes the amplification factor to amplify a signal output from the output circuit, the signal is A/D-converted by the A/D conversion circuit by a plurality of number of times, and the signal A/D-converted by a plurality of number of times is stored in the plurality of line memories, and
the signal processing circuit controls the amplification factor of a signal amplifying circuit in accordance with that of the column amplifying circuit in order to adjust a plurality of output signals simultaneously read out from the plurality of line memories to have the same gradient, and comprises a linear conversion/synthesizing circuit which linearly converts optical input signal amounts to have the same gradient, and synthesizing them into one signal by a switching circuit.

2. The device according to claim 1, further comprising a mode in which the horizontal scan period is prolonged when the A/D conversion circuit performs A/D conversion by a plurality of number of times.

3. The device according to claim 1, wherein
the reading circuit reads out signal charges from the photodiode divisionally by a plurality of number of times in correspondence with the exposure time, and
the detection circuit adds the signal charges read out divisionally by a plurality of number of times.

* * * * *